United States Patent
Maruyama et al.

(10) Patent No.: US 10,710,880 B2
(45) Date of Patent: Jul. 14, 2020

(54) METHOD FOR UPLIFTING CARBON NANOTUBE STRUCTURE, METHOD FOR PRODUCING CARBON NANOTUBE STRUCTURE, AND CARBON NANOTUBE STRUCTURE

(71) Applicant: HITACHI ZOSEN CORPORATION, Osaka (JP)

(72) Inventors: Hiroyuki Maruyama, Osaka (JP); Tetsuya Inoue, Osaka (JP)

(73) Assignee: HITACHI ZOSEN CORPORATION, Osaka (JP)

( * ) Notice: Subject to any disclaimer, the term of this patent is extended or adjusted under 35 U.S.C. 154(b) by 85 days.

(21) Appl. No.: 16/083,345

(22) PCT Filed: Mar. 7, 2017

(86) PCT No.: PCT/JP2017/008952
§ 371 (c)(1),
(2) Date: Sep. 7, 2018

(87) PCT Pub. No.: WO2017/154885
PCT Pub. Date: Sep. 14, 2017

(65) Prior Publication Data
US 2019/0077665 A1    Mar. 14, 2019

(30) Foreign Application Priority Data
Mar. 9, 2016 (JP) .................................. 2016-045888

(51) Int. Cl.
*H01B 1/04* (2006.01)
*C01B 32/158* (2017.01)
(Continued)

(52) U.S. Cl.
CPC ............ *C01B 32/158* (2017.08); *C01B 32/16* (2017.08); *C01B 32/168* (2017.08); *H01B 1/04* (2013.01);
(Continued)

(58) Field of Classification Search
CPC ....... B82Y 30/00; B82Y 40/00; C01B 32/158; C01B 32/16; C01B 32/168; H01L 23/373; H01L 23/42; H05K 7/20009; H01B 1/04
See application file for complete search history.

(56) References Cited

U.S. PATENT DOCUMENTS

2006/0234056 A1    10/2006  Huang et al.
2009/0266477 A1*   10/2009  Weisenberger ........ B82Y 30/00
                                                        156/185
(Continued)

FOREIGN PATENT DOCUMENTS

JP    2006-290736 A    10/2006
JP    2011-204749 A    10/2011
(Continued)

OTHER PUBLICATIONS

International Search Report PCT/JP2017/008952 dated May 9, 2017 with English translation.

*Primary Examiner* — Mark Kopec
*Assistant Examiner* — Jaison P Thomas
(74) *Attorney, Agent, or Firm* — Pillsbury Winthrop Shaw Pittman, LLP

(57) ABSTRACT

A method for uplifting a carbon nanotube structure including a fixture sheet and a carbon nanotube array, wherein in the carbon nanotube array, a plurality of carbon nanotubes removed from a growth substrate are aligned in a predetermined direction, and at least a portion of the plurality of carbon nanotubes is embedded in or bonded to the fixture sheet, the method including the steps of: preparing a carbon
(Continued)

nanotube structure, in which at least a portion of the plurality of carbon nanotubes is fallen down so as to lie one above another relative to the fixture sheet, attaching an adhesive tape to the carbon nanotube array, and removing the adhesive tape from the carbon nanotube array to uplift the plurality of carbon nanotubes relative to the fixture sheet.

3 Claims, 12 Drawing Sheets

(51) Int. Cl.
    *H01L 23/373* (2006.01)
    *C01B 32/16* (2017.01)
    *C01B 32/168* (2017.01)
    *H01L 23/42* (2006.01)
    *H05K 7/20* (2006.01)
    *B82Y 30/00* (2011.01)
    *B82Y 40/00* (2011.01)

(52) U.S. Cl.
    CPC ............ *H01L 23/373* (2013.01); *H01L 23/42* (2013.01); *H05K 7/20009* (2013.01); *B82Y 30/00* (2013.01); *B82Y 40/00* (2013.01)

(56) References Cited

U.S. PATENT DOCUMENTS

| | | | |
|---|---|---|---|
| 2010/0270704 A1* | 10/2010 | Feng | B82Y 30/00 264/291 |
| 2013/0202865 A1* | 8/2013 | Choi | B82Y 30/00 428/216 |
| 2014/0034282 A1 | 2/2014 | Kawamura et al. | |
| 2014/0140008 A1 | 5/2014 | Yamaguchi et al. | |
| 2015/0136360 A1 | 5/2015 | Xu et al. | |
| 2016/0086872 A1 | 3/2016 | Sakita et al. | |

FOREIGN PATENT DOCUMENTS

| | | |
|---|---|---|
| JP | 2014-033104 A | 2/2014 |
| JP | 2014-060252 A | 4/2014 |
| JP | 2014-234338 A | 12/2014 |
| JP | 2015-526904 A | 9/2015 |
| WO | 2013/046291 A1 | 4/2013 |
| WO | 2014/069153 A1 | 5/2014 |
| WO | 2014/196006 A1 | 12/2014 |

* cited by examiner

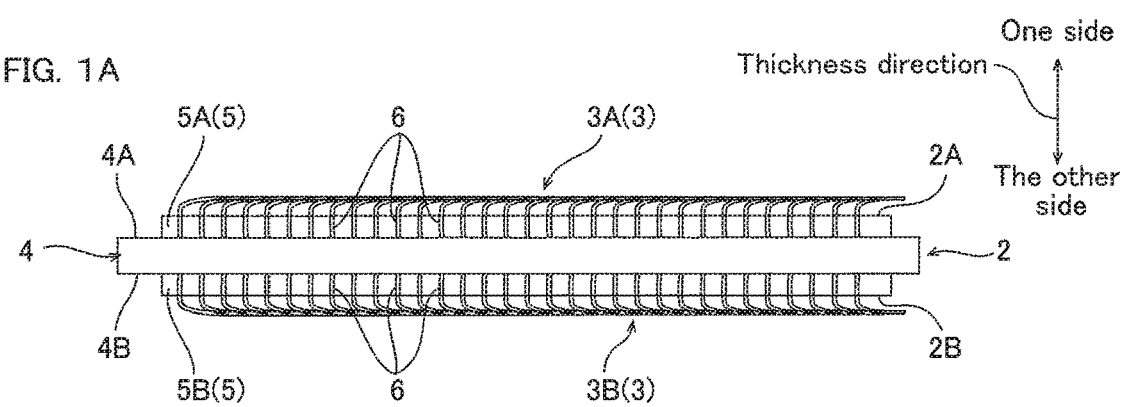
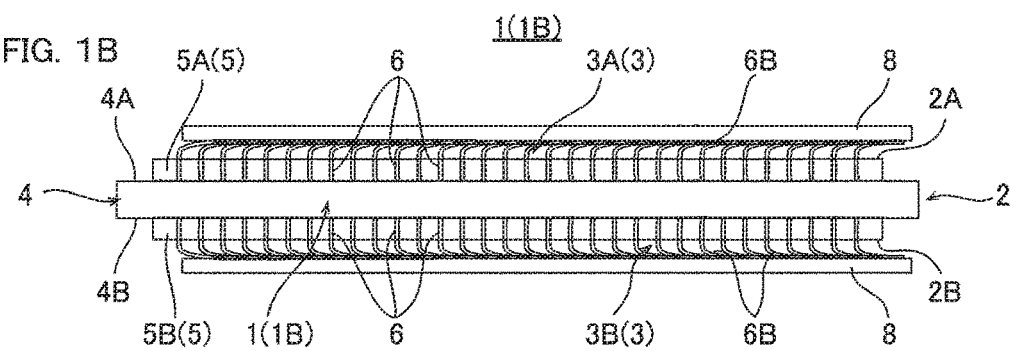
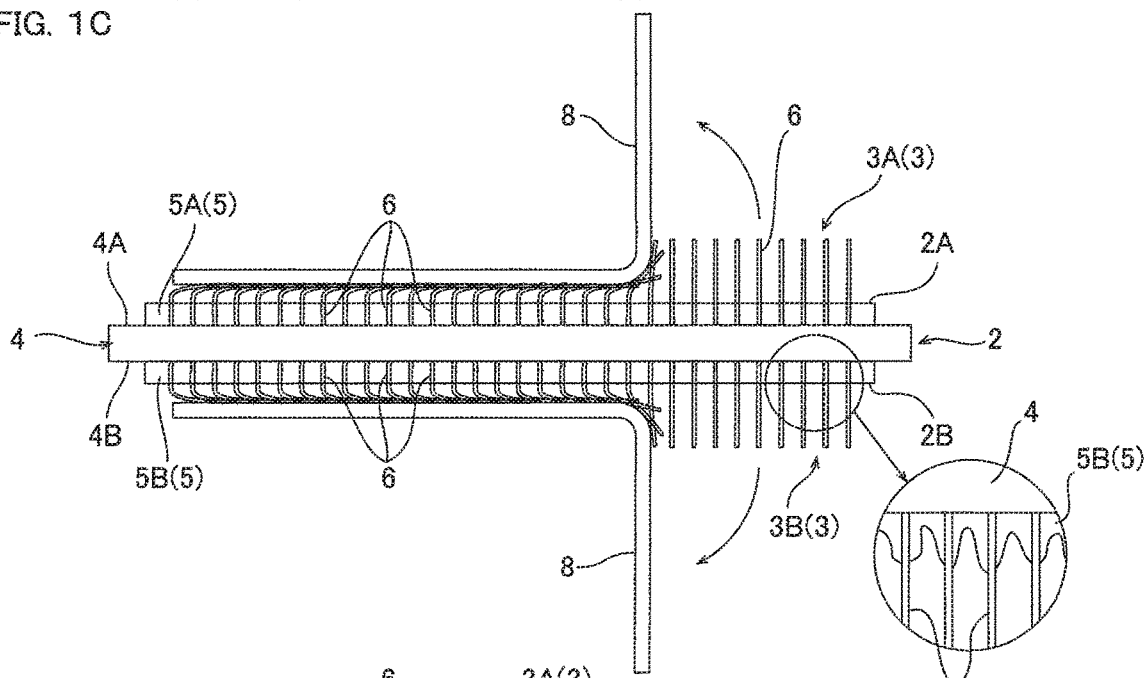
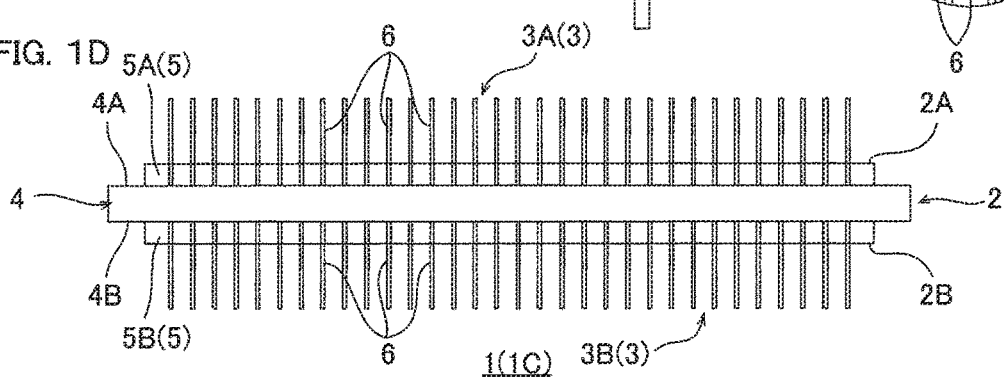

1(1B)

1(1C)

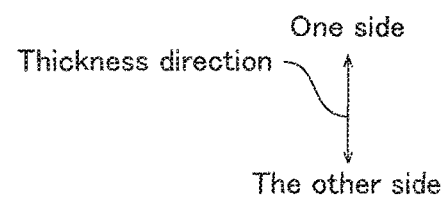
FIG. 10A
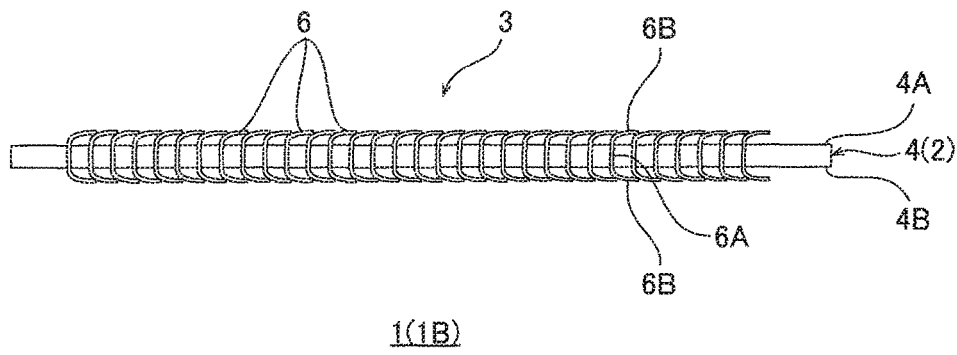
FIG. 10B
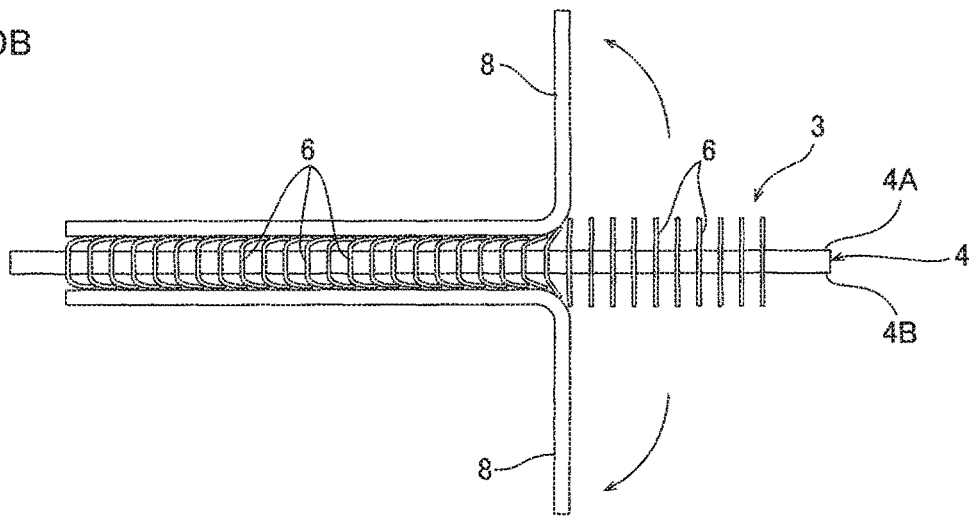
FIG. 10C
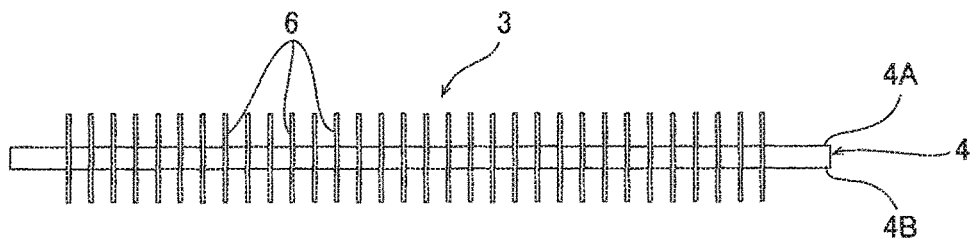

METHOD FOR UPLIFTING CARBON NANOTUBE STRUCTURE, METHOD FOR PRODUCING CARBON NANOTUBE STRUCTURE, AND CARBON NANOTUBE STRUCTURE

CROSS-REFERENCE TO RELATED APPLICATIONS

This is the U.S. National Stage of PCT/JP2017/008952, filed Mar. 7, 2017, which in turn claims priority to Japanese Patent Application No. 2016-045888, filed Mar. 9, 2016, the contents of each of these applications being incorporated herein by reference in their entireties.

TECHNICAL FIELD

The present invention relates to a method for uplifting a carbon nanotube structure, a method for producing a carbon nanotube structure, and a carbon nanotube structure.

BACKGROUND ART

Carbon nanotubes (in the following, referred to as CNT) have been known to have excellent mechanical strength, thermal conductivity, and electric conductivity. Thus, use of the CNT for various industrial products has been examined.

For example, the CNT is used for a thermal conductive material (Thermal Interface Material: in the following, referred to as TIM) disposed between the electronic component and the heat sink.

For such a TIM, for example, Patent Document 1 has proposed a thermal interface pad including a substrate and CNTs arranged in arrays on both sides of the substrate (for example, see Patent Document 1).

Such a thermal interface pad is produced by allowing a plurality of CNTs to grow so as to be aligned vertically to the substrate by chemical vapor deposition. In the thermal interface pad, the plurality of CNTs grown on the substrate can conform to the subtle dents and bumps (surface roughness) of the surfaces of the electronic components and heat sinks, and therefore gaps can be prevented between the electronic component and the heat sink, and thermal conductivity can be improved.

CITATION LIST

Patent Document

Patent Document 1:
JP 2015-526904, A

SUMMARY OF THE INVENTION

Problem to be Solved by the Invention

However, when the thermal interface pad is used as the TIM, the plurality of CNTs vertically aligned relative to the substrate fall down so as to lie one above another relative to the substrate when they make contact with the electronic component and the heat sink.

When such a thermal interface pad is used again, the plurality of CNTs are already fallen down, and therefore there are disadvantages in that it cannot conform to the surface roughness of the electronic component and the heat sink, and a gap is generated between the electronic component and the heat sink, which reduces thermal conductivity.

Thus, the present invention provides a method for uplifting a carbon nanotube structure that allows the fallen plurality of carbon nanotubes to stand relative to the fixture sheet; a method for producing a carbon nanotube structure; and a carbon nanotube structure.

Means for Solving the Problem

The present invention [1] includes a method for uplifting a carbon nanotube structure, the carbon nanotube structure including a fixture sheet and a carbon nanotube array, wherein in the carbon nanotube array, a plurality of carbon nanotubes removed from a growth substrate are aligned in a predetermined direction, and at least a portion of the plurality of carbon nanotubes is embedded in or bonded to the fixture sheet, the method for uplifting a carbon nanotube structure including: preparing a carbon nanotube structure in which at least a portion of the plurality of carbon nanotubes is fallen down so as to lie one above another relative to the fixture sheet; attaching an adhesive tape to the carbon nanotube array; and removing the adhesive tape from the carbon nanotube array to uplift the plurality of carbon nanotubes relative to the fixture sheet.

In the plurality of CNTs grown on the substrate by the chemical vapor deposition (CVD method), sufficient adhesive strength between the substrate and the CNT cannot be secured.

Therefore, when using the plurality of CNTs grown on the substrate as the TIM, and the plurality of CNTs are fallen down so as to lie one above another relative to the substrate, even if the adhesive tape is attached to the plurality of fallen CNTs and removed, the plurality of CNTs cannot be allowed to stand relative to the substrate, and the plurality of CNTs are removed from the substrate along with the adhesive tape.

In contrast, with the above method, at least a portion of the plurality of CNTs of the carbon nanotube array (in the following, referred to as CNT array) removed from the growth substrate is embedded in or bonded to the fixture sheet, and therefore adhesive strength between the fixture sheet and the CNT can be improved.

Therefore, even if at least a portion of the plurality of CNTs is fallen down so as to lie one above another relative to the fixture sheet, by attaching the adhesive tape to the CNT array, and removing the adhesive tape from the CNT array, separation of the plurality of CNTs from the fixture sheet can be suppressed, and the plurality of CNTs can be allowed to stand relative to the fixture sheet.

That is, with an easy method, the plurality of fallen CNTs so as to lie one above another relative to the fixture sheet can be allowed to stand relative to the fixture sheet.

The present invention [2] includes a method for producing a carbon nanotube structure, the method including: preparing a carbon nanotube structure including a fixture sheet and a carbon nanotube array, in which a plurality of carbon nanotubes removed from a growth substrate are aligned in a predetermined direction, and at least a portion of the plurality of carbon nanotubes is embedded in or bonded to the fixture sheet; allowing at least a portion of the plurality of carbon nanotubes to fall down so as to lie one above another relative to the fixture sheet; attaching an adhesive tape to the carbon nanotube array; and removing the adhesive tape from the carbon nanotube array to uplift the plurality of carbon nanotubes relative to the fixture sheet.

However, in the prepared CNT structure, the plurality of CNTs are sometimes insufficiently uplifted relative to the fixture sheet. In such a CNT structure, usable portion of the plurality of CNTs is reduced, and therefore desired characteristics may not be sufficiently secured.

In contrast, with the above method, in the prepared CNT structure, at least a portion of the plurality of CNTs is fallen down so as to lie one above another relative to the fixture sheet, and thereafter the adhesive tape is attached to the CNT array, and the adhesive tape is removed from the CNT array to allow the plurality of CNTs to stand relative to the fixture sheet.

Therefore, the plurality of CNTs can be sufficiently and reliably uplifted relative to the fixture sheet. Therefore, a CNT structure with the following can be produced with an easy method: the plurality of CNTs are sufficiently and reliably uplifted relative to the fixture sheet, and desired characteristics are sufficiently secured.

The present invention [3] includes the method for producing a carbon nanotube structure of [2], wherein the following set of the steps is performed a plurality of times: allowing at least a portion of the plurality of carbon nanotubes to fall down so as to lie one above another relative to the fixture sheet; attaching the adhesive tape to the carbon nanotube array; and removing the adhesive tape from the carbon nanotube array to uplift the plurality of carbon nanotubes relative to the fixture sheet.

With this method, the following set of steps is performed a plurality of times, and therefore the plurality of carbon nanotubes can be reliably uplifted relative to the fixture sheet: a step of allowing the plurality of carbon nanotubes to fall down; a step of attaching the adhesive tape to the carbon nanotube array; and a step of removing the adhesive tape from the carbon nanotube array.

The present invention [4] includes a carbon nanotube structure including a fixture sheet and a carbon nanotube array, in which a plurality of carbon nanotubes removed from the growth substrate are aligned in a predetermined direction, wherein the plurality of carbon nanotubes are uplifted relative to the fixture sheet by allowing at least a portion of the plurality of carbon nanotubes to fall down so as to lie one above another relative to the fixture sheet, and attaching the adhesive tape to the carbon nanotube array and removing the adhesive tape from the carbon nanotube array.

With this structure, at least a portion of the plurality of CNTs is embedded in or bonded to the fixture sheet, and therefore adhesiveness between the fixture sheet and the CNT can be improved.

The plurality of CNTs are uplifted relative to the fixture sheet, and therefore by allowing at least a portion of the plurality of CNTs to fall down so as to lie one above another relative to the fixture sheet, attaching the adhesive tape to the plurality of CNTs and removing the adhesive tape from the plurality of CNTs, uplifting relative to the fixture sheet is sufficient and reliable. Therefore, desired characteristics of the CNT structure can be sufficiently secured.

Effects of the Invention

With the method for uplifting a carbon nanotube structure of the present invention, the plurality of fallen CNTs can be uplifted relative to the fixture sheet with an easy method.

With the method for producing a carbon nanotube structure of the present invention, a CNT structure with desired characteristics can be sufficiently secured with an easy method.

The carbon nanotube structure of the present invention can sufficiently secure desired characteristics.

BRIEF DESCRIPTION OF THE DRAWINGS

FIG. 1A illustrates a first embodiment of the method for uplifting a carbon nanotube structure of the present invention, showing a step of preparing a thermal conductive sheet in which a plurality of carbon nanotubes (the plurality of CNTs) are fallen down relative to the fixture sheet. FIG. 1B shows, following FIG. 1A, a step of attaching an adhesive tape to the CNT array. FIG. 1C shows, following FIG. 1B, a step of removing the adhesive tape from the CNT array. FIG. 1D shows the thermal conductive sheet, in which the plurality of CNTs are uplifted relative to the fixture sheet due to the step shown in FIG. 1C.

FIG. 10A illustrates an eighth embodiment of the method for uplifting a carbon nanotube structure of the present invention, showing a step of preparing a carbon nanotube structure, in which the plurality of CNTs are fallen down relative to the fixture sheet. FIG. 10B shows, following FIG. 10A, a step of attaching the adhesive tape to the CNT array, and removing the adhesive tape from the CNT array. FIG. 10C shows a carbon nanotube structure, in which the plurality of CNTs are uplifted relative to the fixture sheet by the step shown in FIG. 10B.

DESCRIPTION OF THE EMBODIMENTS

Figure 2A:
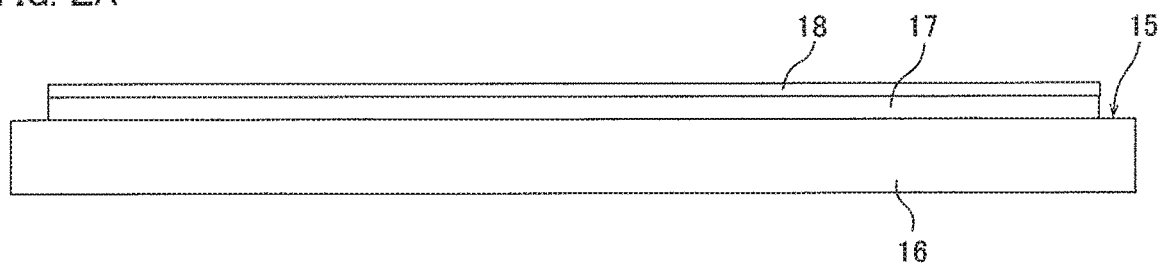
FIG. 2A illustrates an embodiment of the step of allowing the vertically aligned carbon nanotubes (VACNTs) to grow on a growth substrate, showing a step of forming a catalyst layer on the substrate.

First Embodiment (Reuse Method of Thermal Conductive Sheet)

The first embodiment of the method for uplifting a plurality of carbon nanotubes of the present invention includes, for example, as shown in FIG. 1A to FIG. 1D, a step of preparing a thermal conductive sheet 1 as an example of the carbon nanotube structure, including a fixture sheet 2 and a carbon nanotube array 3 (in the following, referred to as CNT array 3); a step of attaching an adhesive tape 8 to the CNT array 3; and a step of removing the adhesive tape 8 from the CNT array 3.

(1) Preparation Step of Thermal Conductive Sheet

Figure 4A:
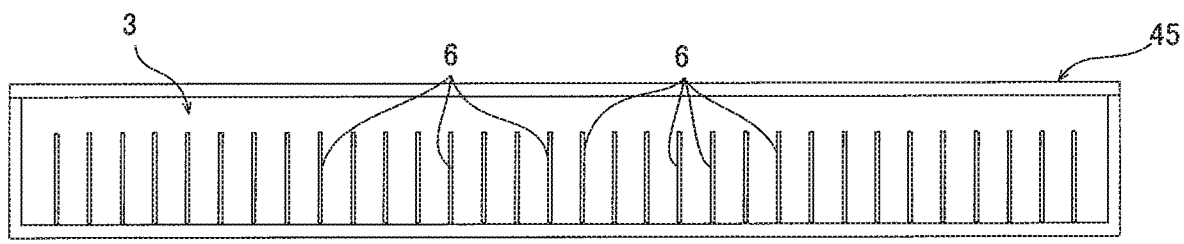
FIG. 4A illustrates a step of densifying the CNT array shown in FIG. 3C, showing a step of accommodating the CNT array in a heat-resistant vessel.
Figure 4B:
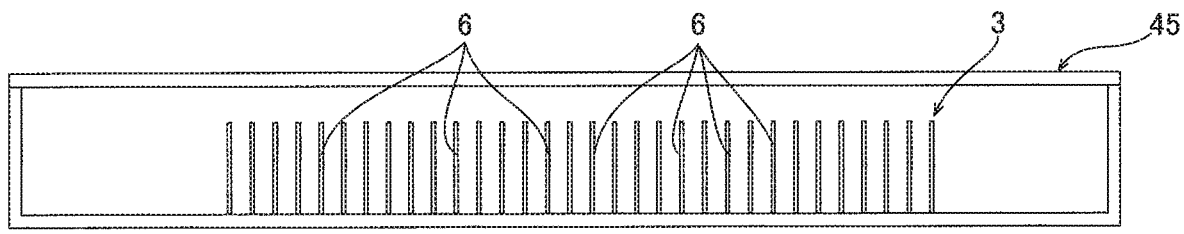
FIG. 4B shows, following FIG. 4A, a step of heating the CNT array to densify the CNT array.
Figure 4C:
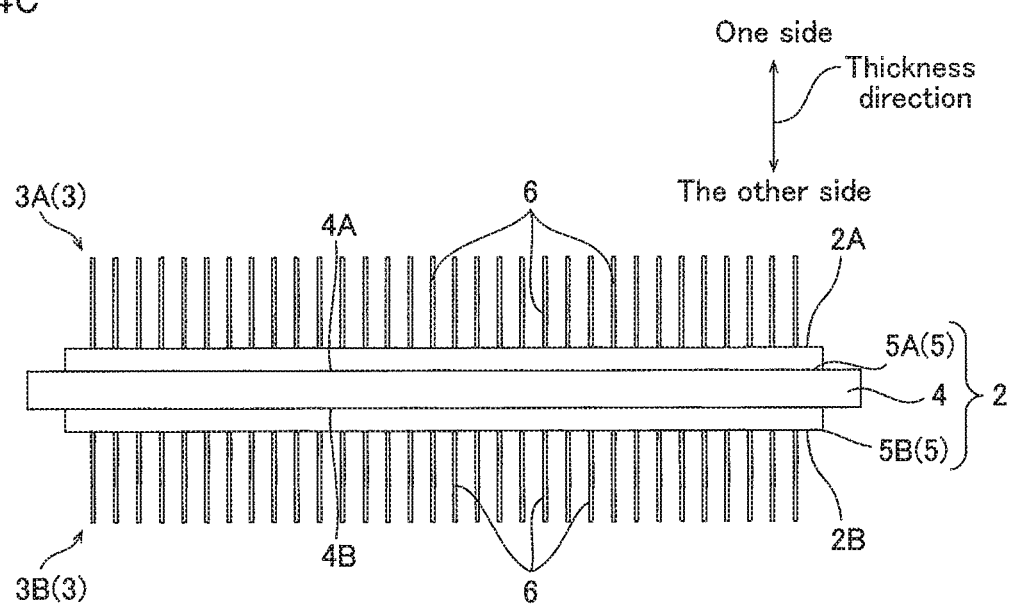
FIG. 4C shows a step of disposing the densified CNT array shown in FIG. 4B on both sides of the front face and the back face of the fixture sheet.

To prepare the thermal conductive sheet 1, first, as shown in FIG. 4C, the fixture sheet 2 is prepared. In the first embodiment, the fixture sheet 2 is capable of fixing two CNT arrays 3, and includes a substrate 4 and two resin layers 5.

To prepare the fixture sheet 2, for example, the resin layer 5 is disposed on both sides of the front face 4A and the back face 4B of the substrate 4 (fixture sheet preparation step).

The substrate 4 has a sheet shape (film shape), to be specific, the substrate 4 has a predetermined thickness, extends in a surface direction orthogonal to its thickness direction (vertical direction and lateral direction), and has a flat front face 4A (one side in thickness direction) and a flat back face 4B (the other side in thickness direction).

The substrate 4 has, preferably, flexibility. The substrate 4 has a thickness of, for example, 10 μm or more, preferably 50 μm or more, and for example, 300 μm or less, preferably 150 μm or less.

Examples of the substrate 4 include a conductive substrate and an insulative substrate.

The conductive substrate has electric conductivity, and examples thereof include a metal sheet, graphite sheet, carbon nanotube assembly, and a resin sheet containing electroconductive particles.

The metal sheet is a sheet made from metal. Examples of the metal include gold, silver, copper, iron, aluminum, titanium, silicon, and alloys thereof, and preferably, copper and aluminum are used.

The graphite sheet is a sheet formed from graphite.

The carbon nanotube assembly is an assembly of the plurality of CNTs, and examples thereof include a press molded sheet, CNT array (described later), carbon nanotube web stacked sheet (in the following, referred to as web stacked sheet).

The press molded sheet is formed into a sheet by a known press molding from the plurality of CNTs, and the plurality of CNTs are disposed at random.

The web stacked sheet is formed by stacking a plurality of carbon nanotube webs, in which a plurality of carbon nanotube single yarns are arranged in line to form a sheet. The carbon nanotube single yarns are formed by continuously connecting bundles of the plurality of CNTs linearly.

The resin sheet containing electroconductive particles is a sheet formed from a resin material in which electroconductive particles are dispersed. Examples of the electroconductive particles include particles of the above-described metals, and carbon materials (for example, CNT, graphite, fullerene, graphene, etc.). Such electroconductive particles can be used singly, or can be used in combination of two or more.

Examples of the resin material include thermoplastic resin (for example, polyester, polyolefin, polyvinyl alcohol (PVA), polyamide, polystyrene, polyvinyl chloride, polyvinylidene chloride, polyacrylonitrile, polyurethane, and fluorine polymer, thermoplastic elastomer, etc.). These resin materials can be used singly, or can be used in combination of two or more.

Of these conductive substrates, preferably, a metal sheet is used.

The insulative substrate is electrically non-conductive, and for example, ceramic sheets are used.

The ceramic sheet is formed from a sintered inorganic material sheet. Examples of the inorganic material include inorganic oxides (for example, silica, alumina, titanium oxide, zinc oxide, magnesium oxide, etc.), inorganic nitrides (for example, aluminum nitride, boron nitride, silicon nitride, etc.), and inorganic carbides (for example, silicon carbide, titanium carbide, tungsten carbide, etc.). Such inorganic materials can be used singly, or can be used in combination of two or more.

The substrate 4 is suitably selected in accordance with application of the thermal conductive sheet 1. When a conductive substrate is selected for the substrate 4, electro-conductivity can be given to the thermal conductive sheet 1, and the thermal conductive sheet 1 is configured as an electro-thermal conductive sheet. When an insulative substrate is selected for the substrate 4, electrically non-conductive properties can be given to the thermal conductive sheet 1, and the thermal conductive sheet 1 is configured as an insulative thermal conductive sheet.

The resin layer 5 is formed from a resin material. Examples of the resin material include thermosetting resin and thermoplastic resin.

The thermosetting resin is a cured product (thermosetting resin after curing), and examples thereof include epoxy resin, polyimide resin, phenol resin, urea resin, melamine resin, unsaturated polyester resin, thermosetting elastomer (for example, urethane rubber, butyl rubber, fluorine rubber, silicone rubber, acrylic rubber, etc.).

Examples of the thermoplastic resin include polyester (for example, polyethylene terephthalate, etc.), polyolefin (for example, polyethylene, polypropylene, etc.), polyamide, polystyrene, polyvinyl chloride, polyvinyl alcohol (PVA), polyvinylidene chloride, polyacrylonitrile, polyurethane, fluorine polymer (for example, polytetrafluoroethylene (PTFE), perfluoroalkoxyalkane (PFA), polyvinyl fluoride, polyvinylidene fluoride, etc.), thermoplastic elastomer (for example, olefin elastomer (for example, ethylene-propylene rubber, ethylene-propylene-diene rubber, etc.), styrene elastomer, and vinyl chloride elastomer, etc.).

These resin materials can be used singly, or can be used in combination of two or more. Of these resin materials, preferably, thermoplastic resin, more preferably, fluorine polymer and PFA are used.

In the first embodiment, the resin layer 5 is formed from thermoplastic resin, the case of which is described next.

Figure 5A:
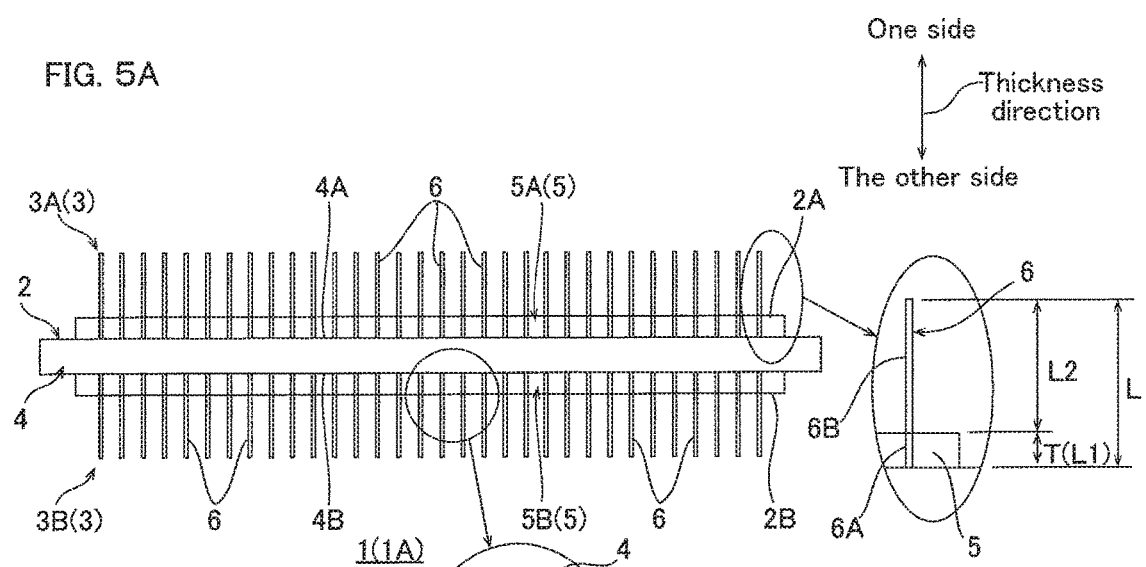
FIG. 5A shows a step of embedding the CNT array shown in FIG. 4C in the fixture sheet to prepare the thermal conductive sheet.

The resin layer 5 has a thickness T of, as shown in FIG. 5A, for example, 10 μm or more, preferably 20 μm or more, and for example, 50 μm or less, preferably 40 μm or less. The thickness T of the resin layer 5 is, when the thickness of the substrate 4 is 100, for example, 10 or more, preferably 20 or more, and for example, 50 or less, preferably 40 or less.

The resin layer 5 may contain, as necessary, known additives. Examples of the additive include the above-described metal particles, inorganic oxides, inorganic nitrides, and carbon materials. These additives can be used singly, or can be used in combination of two or more.

Then, as shown in FIG. 4C, the resin layer 5 can be disposed on both the front face 4A and the back face 4B of the substrate 4 by any method without limitation. For example, the above-described thermoplastic resin is applied on both sides of the substrate 4 to form the resin layer 5, or a resin sheet formed from the above-described thermoplastic resin is prepared, and disposed on both sides of the substrate 4. Of these methods, preferably, the resin sheet is formed from the thermoplastic resin, and then disposed on both sides of the substrate 4.

In this manner, the fixture sheet 2 including the substrate 4, and the resin layer 5 disposed on both sides of the front face 4A and the back face 4B of the substrate 4 is prepared.

When the two resin layers 5 are distinguished from each other, the resin layer 5 disposed on the front face 4A of the substrate 4 is named a first resin layer 5A, and the resin layer 5 disposed on the back face 4B of the substrate 4 is named a second resin layer 5B.

One side surface in the thickness direction of the first resin layer 5A corresponds to the front face 2A of the fixture sheet 2, and the other side surface in the thickness direction of the second resin layer 5B corresponds to the back face 2B of the fixture sheet 2. That is, the fixture sheet 2 has a front face 2A (one side in the thickness direction of the first resin layer 5A) and a back face 2B (the other side in the thickness direction of the second resin layer 5B).

Aside from the fixture sheet 2, a CNT array 3 removed from the growth substrate 15 is prepared (CNT array preparation step).

Figure 2B:
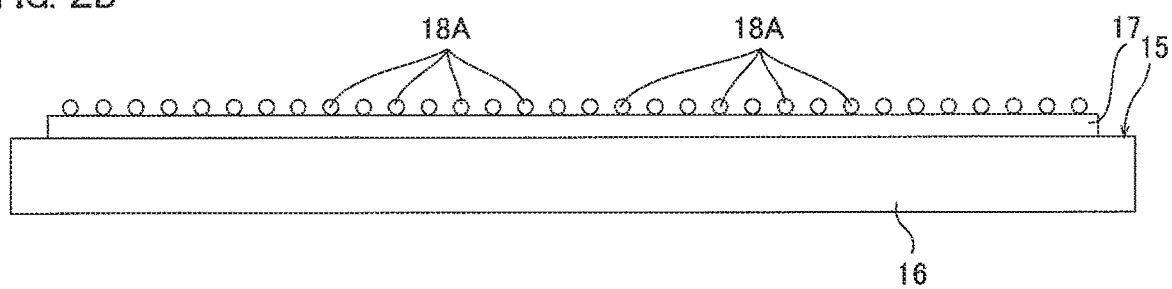
FIG. 2B shows, following FIG. 2A, a step of heating the substrate to cause coagulation of the catalyst layer into a plurality of granular bodies.
Figure 2C:
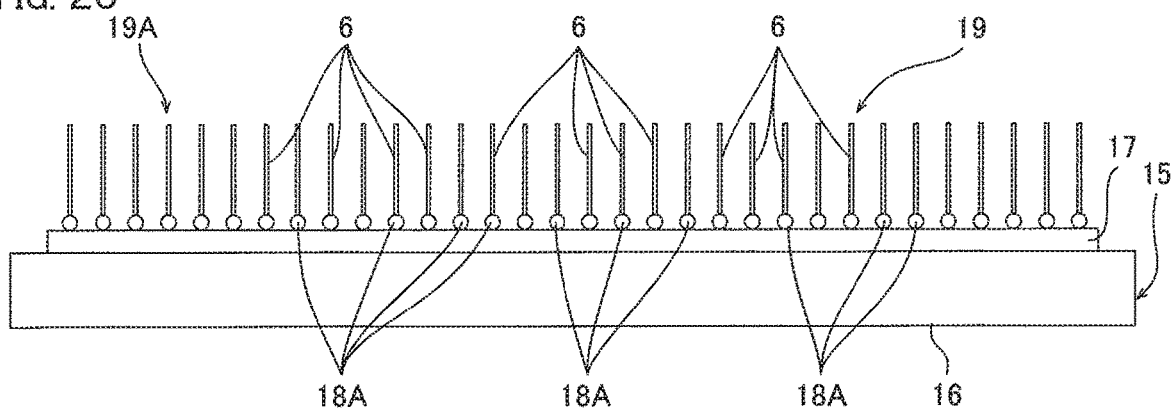
FIG. 2C shows, following FIG. 2B, a step of supplying a source gas to the plurality of granular bodies to grow the plurality of CNTs to prepare the VACNTs.

To prepare the CNT array 3, first, as shown in FIG. 2A to FIG. 2C, the vertically aligned carbon nanotube 19 (Vertically Aligned carbon nanotubes, in the following, referred to as VACNTs 19) is allowed to grow on the growth substrate 15 by, for example, the chemical vapor deposition (CVD) method).

To be specific, as shown in FIG. 2A, first, the growth substrate 15 is prepared. The growth substrate 15 is not particularly limited, and for example, a known substrate used for CVD method is used, and a commercially available product can be used.

Examples of the growth substrate 15 include silicon substrate, and a stainless steel substrate 16 on which a silicon dioxide film 17 is stacked, and preferably, the stainless steel substrate 16 on which the silicon dioxide film 17 is stacked is used. In FIG. 2A to FIG. 3C, the growth substrate 15 is the stainless steel substrate 16 on which the silicon dioxide film 17 is stacked.

Then, as shown in FIG. 2A, on the growth substrate 15, preferably on the silicon dioxide film 17, a catalyst layer 18 is formed. To form the catalyst layer 18 on the growth substrate 15, a film of metal catalyst is formed by a known film-forming method on the growth substrate 15 (preferably, silicon dioxide film 17).

Examples of the metal catalyst include iron, cobalt, and nickel, preferably, iron is used. Such a metal catalyst can be used singly, or can be used in combination of two or more. Examples of the film-forming method include vacuum deposition and sputtering, and preferably, vacuum deposition is used.

In this manner, the catalyst layer 18 is disposed on the growth substrate 15. When the growth substrate 15 is a stainless steel substrate 16 on which the silicon dioxide film 17 is stacked, the silicon dioxide film 17 and the catalyst layer 18 can be formed simultaneously by, for example, as described in Japanese Unexamined Patent Publication No. 2014-94856, applying a mixture solution in which a silicon dioxide precursor solution and a metal catalyst precursor solution are mixed on a stainless steel substrate 16, and thereafter causing phase separation in the mixture solution, and then drying.

Then, the growth substrate 15 on which the catalyst layer 18 is disposed is heated, as shown in FIG. 2B, for example, at 700° C. or more and 900° C. or less. In this manner, the catalyst layer 18 goes through coagulation to form a plurality of granular bodies 18A.

Then, a source gas is supplied to the heated growth substrate 15, as shown in FIG. 2C. The source gas contains a hydrocarbon gas with a number of carbon atoms of 1 to 4 (lower hydrocarbon gas). Examples of the hydrocarbon gas with carbon atoms of 1 to 4 include methane gas, ethane gas, propane gas, butane gas, ethylene gas, and acetylene gas, and preferably, acetylene gas is used.

The source gas can contain, as necessary, hydrogen gas, inert gas (for example, helium, argon, etc.), and water vapor.

The supply time of the source gas may be, for example, 1 minute or more, preferably 5 minutes or more, and for example, 60 minutes or less, preferably 30 minutes or less.

In this manner, the plurality of CNTs 6 are allowed to grow, originating from the plurality of granular bodies 18A. In FIG. 2C, for convenience, one CNT 6 is grown from the one granular body 18A, but it is not limited thereto, and a plurality of CNTs 6 can be grown from one granular body 18A.

The plurality of CNTs 6 extend on the growth substrate 15 in the thickness direction (up-down direction) of the growth substrate 15 to be parallel to be each other. That is, the plurality of CNTs 6 are aligned orthogonal to the growth substrate 15 (vertically aligned).

The CNT 6 may be a single-walled carbon nanotube, double-walled carbon nanotube, or multi-walled carbon nanotube, and a multi-walled carbon nanotube is preferable. The plurality of CNTs 6 may include only one of the single-walled carbon nanotube, double-walled carbon nanotube, and multi-walled carbon nanotube, or may include two or more of the single-walled carbon nanotube, double-walled carbon nanotube, and multi-walled carbon nanotube. The CNTs 6 have flexibility.

The CNTs 6 have an average external diameter of, for example, 1 nm or more, preferably 5 nm or more, and for example, 100 nm or less, preferably 50 nm or less, more preferably 20 nm or less.

The CNTs 6 have an average length L (average size in aligned direction) larger than the thickness T of the resin layer 5 (ref: FIG. 5A), for example, 15 μm or more, preferably 50 μm or more, and for example, 1000 μm or less, preferably 500 μm or less, more preferably 200 μm or less. The average external diameter and the average length of CNT are measured, for example, by a known method such as electron microscope observation.

The ratio of the average length L of the CNTs 6 relative to the thickness T of the resin layer 5 is, for example, more than 1, preferably 1.5 or more, more preferably 2.0 or more, and for example, 15.0 or less, preferably 10.0 or less, more preferably 5.0 or less.

In this manner, the VACNTs 19 grow on the growth substrate 15. The VACNTs 19 include, as shown in FIG. 3C, a plurality of rows 19A in lateral direction, in which the plurality of CNTs 6 are arranged in line in vertical direction.

In the VACNTs 19, the plurality of CNTs 6 are densified in the surface direction (vertical direction and lateral direction). To be specific, the VACNTs 19 (the plurality of CNTs 6) have an average bulk density of, for example, 10 mg/cm$^3$ or more, preferably 20 mg/cm$^3$ or more, and for example, 50 mg/cm$^3$ or less. The average bulk density is calculated from, for example, mass per unit area (basis weight: unit mg/cm$^2$) and average length of CNT (measured by SEM (manufactured by JEOL Ltd.) or non-contact film thickness meter (manufactured by KEYENCE Corporation)).

Figure 3A:
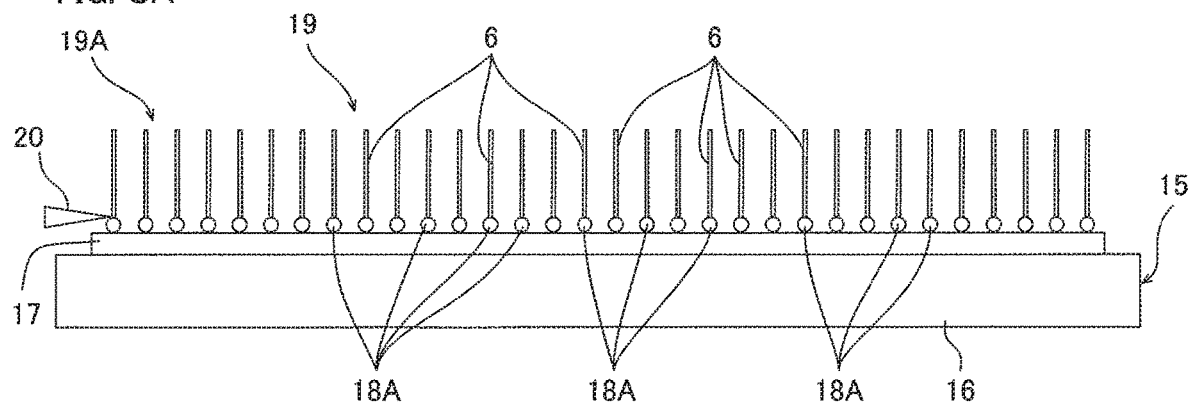
FIG. 3A illustrates a step of removing the VACNTs from the growth substrate, showing a step of cutting the VACNTs from the growth substrate.
Figure 3B:
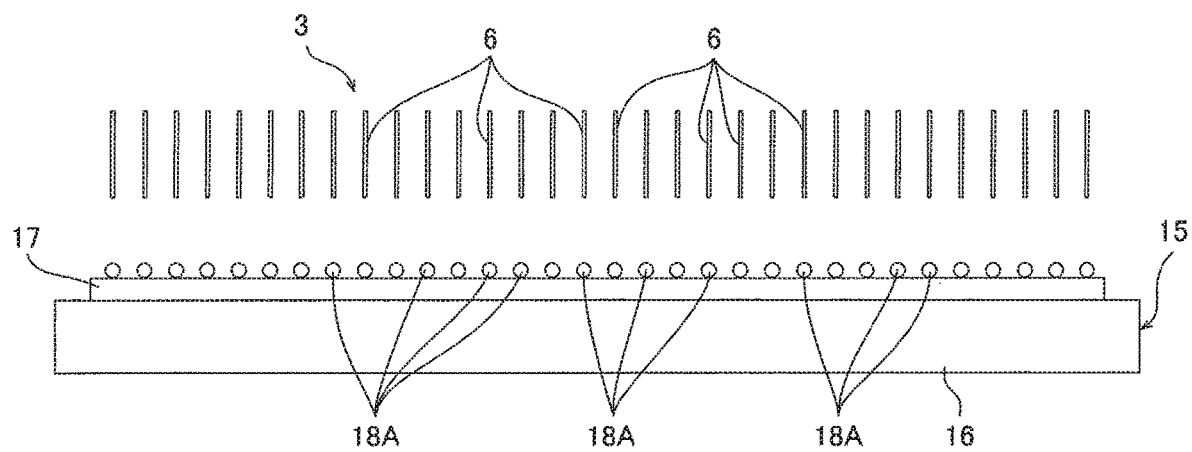
FIG. 3B shows, following FIG. 3A, a step of removing the VACNTs from the growth substrate to form a carbon nanotube array (CNT array).
Figure 3C:
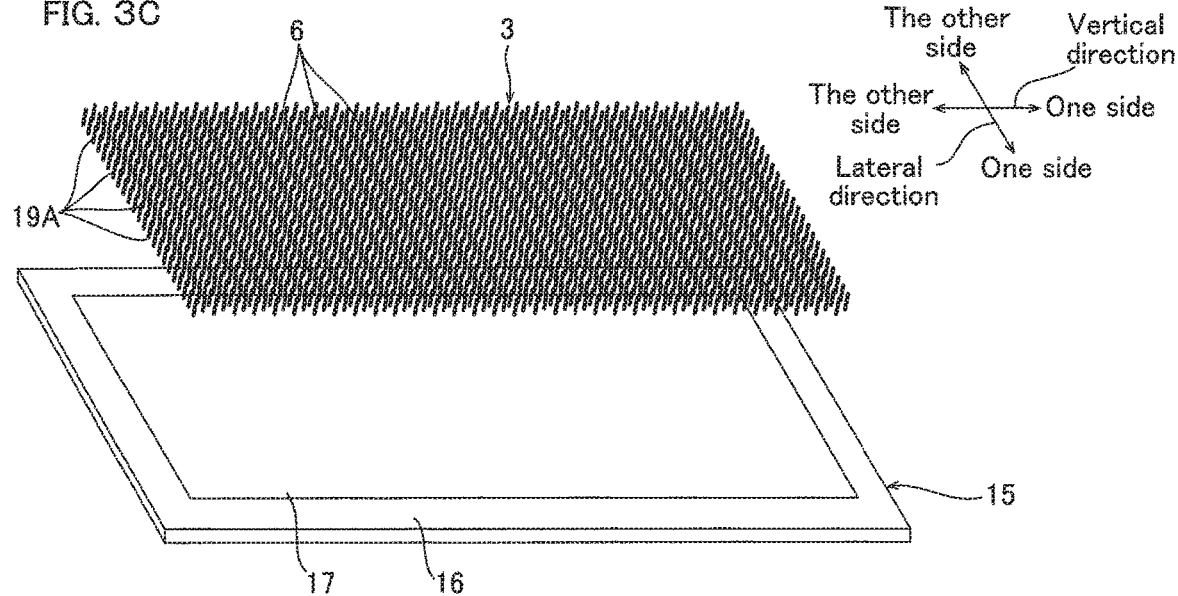
FIG. 3C shows a perspective view of the CNT array shown in FIG. 3B.

Then, as shown in FIG. 3A and FIG. 3B, the VACNTs 19 are removed from the growth substrate 15.

To remove the VACNTs 19 from the growth substrate 15, for example, a cutting blade 20 is slid along the upper face of the growth substrate 15 to collectively cut the proximal end portion (growth substrate 15 side end portion) of the plurality of CNTs 6. The VACNTs 19 are separated from the growth substrate 15 in this manner.

Examples of the cutting blade 20 include known metal blades such as a cutter blade, and a razor, and preferably, a cutter blade is used.

Then, the separated VACNTs 19 are taken out, as shown in FIG. 3B, from the growth substrate 15. In this manner, the VACNTs 19 are removed from the growth substrate 15 to be a CNT array 3. By repeating the above-described steps, two CNT arrays 3 are prepared.

The CNT array 3 is removed from the growth substrate 15, as shown in FIG. 3C, and is a carbon nanotube assembly formed into a sheet from the plurality of CNTs 6.

To be more specific, the plurality of CNTs 6 in the CNT array 3 are aligned in the thickness direction of the CNT array 3, and are arranged to be continuous in surface direction (vertical direction and lateral direction) to be formed into a sheet, without being continuous in the thickness direction.

That is, the CNT array 3 is formed into a sheet by the plurality of CNTs 6 aligned in a predetermined direction and continued in a direction orthogonal to the aligning direction of the CNT 6.

In this manner, the CNT array 3 keeps its shape while being removed from the growth substrate 15 so that the plurality of CNTs 6 make contact with each other in the surface direction. The CNT array 3 has flexibility. Of the plurality of CNTs 6, van der Waals force acts between CNTs 6 that are adjacent to each other.

The average bulk density range of the CNT array 3 is the same as the above-described average bulk density range of the VACNTs 19.

The CNT array 3 has a G/D ratio of, for example, 1 or more and 10 or less. The G/D ratio is, in Raman spectrum of the carbon nanotube, ratio of spectrum intensity of G-band, i.e., the peak observed near 1590 cm$^{-1}$, relative to spectrum intensity of D-band, i.e., the peak observed near the 1350 cm$^{-1}$. The D-band spectrum is derived from carbon nanotube deficiency, and the G-band spectrum is derived from in-plane vibration of 6-membered ring of carbon.

Such a CNT array 3 can be used as the thermal conductive sheet 1 as is, but because of its relatively low average bulk density, in view of improvement in thermal conductivity, preferably, it is densified.

Examples of the densification include, for example, heating the CNT array 3 (ref: FIG. 4A and FIG. 4B), and supplying a volatile liquid to the CNT array 3.

To heat the CNT array 3, for example, as shown in FIG. 4A, the CNT array 3 is accommodated in a heat-resistant vessel 45, and place it in a heating furnace.

The heat resistant vessel 45 is a heat resistant vessel having a heat-resistant temperature of more than 2600° C., and examples thereof include known heat resistant vessels such as a carbon vessel made from carbon and a ceramic vessel made from ceramics. Of these heat resistant vessels, preferably, carbon vessel is used.

Examples of the heating furnace include a resistance heating furnace, induction heating furnace, and direct electric furnace, and preferably, the resistance heating furnace is used. The heating furnace may be a batch type, or a continuous type.

Then, an inert gas is supplied to the heating furnace to replace inside the heating furnace with an inert gas atmosphere. Examples of the inert gas include nitrogen and argon, and preferably, argon is used.

Then, the temperature in the heating furnace is increased at a predetermined temperature increase speed to the heating temperature, and thereafter it is allowed to stand for a predetermined time while the temperature is kept.

The temperature can be increased by, for example, 1° C./minute or more, preferably 5° C./minute or more, and for example, 40° C./minute or less, preferably 20° C./minute or less.

Examples of the heating temperature include 2600° C. or more, preferably 2700° C. or more, more preferably 2800° C. or more. When the heating temperature is the above-described lower limit or more, in the CNT array 3, the plurality of CNTs 6 can be aggregated reliably.

The heating temperature can be less than the sublimation temperature of the CNT 6, preferably 3000° C. or less. When the heating temperature is the above-described upper limit or less, sublimation of the CNT 6 can be suppressed.

Examples of the predetermined time include, 10 minutes or more, preferably 1 hour or more, and for example, 5 hours or less, preferably 3 hours or less.

The CNT array 3 is heated, preferably, under no load (while no load is applied to the CNT array 3, that is, under atmospheric pressure). To heat the CNT array 3 under no load, the CNT array 3 is accommodated in the heat-resistant vessel 45 so that it is spaced apart from the lid and side walls of the heat-resistant vessel 45.

The CNT array 3 is heated in the above-described manner. When the CNT array 3 is heated, in the CNT array 3, crystallinity of graphene forming the plurality of CNTs 6 improves, and the CNT 6 alignment (linearity) improves. Then, in the CNT array 3, the CNTs 6 adjacent to each other gather together to form bundles while keeping their alignment (linearity) due to van der Waals force working between them.

In this manner, the CNT array 3 is entirely aggregated homogenously, and the CNT array 3 is densified. Thereafter, the CNT array 3 is cooled (for example, natural cooling) as necessary.

The CNT array 3 after heating has a thickness of about the same as the thickness of the CNT array 3 before heating (alignment direction length of CNT 6), because the plurality of CNTs 6 are densified while keeping their alignment (linearity). To be specific, the thickness of the CNT array 3 after heating relative to the thickness of the CNT array 3 before heating is, for example, 95% or more and 105% or less, preferably 100%.

The CNT array 3 after heating has a volume of, relative to the volume of the CNT array 3 before heating, for example, 10% or more, preferably 30% or more, and for example, 70% or less, preferably 50% or less. The CNT array 3 after heating has a G/D ratio of, for example, more than 10, and for example, 20 or less.

When a volatile liquid is supplied to the CNT array 3, for example, the volatile liquid is sprayed over the CNT array 3, or the CNT array 3 is immersed in the volatile liquid.

Examples of the volatile liquid include water and an organic solvent. Examples of the organic solvent include lower (C1 to 3) alcohols (for example, methanol, ethanol, propanol, etc.), ketones (for example, acetone, etc.), ethers (for example, diethylether, tetrahydrofuran, etc.), alkylesters (for example, ethyl acetate, etc.), halogenated aliphatic hydrocarbons (for example, chloroform, dichloromethane, etc.), polar aprotic solvents (for example, N-methylpyrrolidone, dimethylformamide, etc.), aliphatic hydrocarbons (for example, hexane, heptane, octane, etc.), alicyclic hydrocarbons (for example, cyclohexane, methylcyclohexane, etc.), and aromatic hydrocarbons (for example, benzene, toluene, etc.).

Of these volatile liquids, preferably, water and aliphatic hydrocarbons are used. Such a volatile liquid can be used singly, or can be used in combination of two or more.

When the volatile liquid is supplied to the CNT array 3, the volatile liquid is vaporized, and the plurality of CNTs 6 gather together, which improves density of the CNT array 3.

Such densifying treatment is performed at least once, and it can be repeated a plurality of times. The same densifying treatment can be repeated a plurality of times, and different types of densifying treatment can be performed in combination. For example, the above-described heating treatment singly can be repeated a plurality of times, or the above-described heating treatment can be performed in combination with the above-described liquid supply treatment.

The CNT array 3 after the densification has an average bulk density of, for example, 50 mg/cm$^3$ or more, preferably 100 mg/cm$^3$ or more, and for example, 500 mg/cm$^3$ or less, preferably 300 mg/cm$^3$ or less, more preferably 200 mg/cm$^3$ or less.

In the above-described manner, the fixture sheet 2 including the substrate 4 and two resin layers 5, and two CNT arrays 3 are prepared.

Then, as shown in FIG. 4C, one CNT array 3 is disposed on the first resin layer 5A (front side resin layer 5), and the other CNT array 3 is disposed on the second resin layer 5B (back side resin layer 5) (disposing step).

To distinguish the two CNT arrays 3 from each other, the CNT array 3 disposed on the first resin layer 5A is named the first CNT array 3A and the CNT array 3 disposed on the second resin layer 5B is named the second CNT array 3B.

That is, the first CNT array 3A is disposed on one side in the thickness direction of the first resin layer 5A (front face 2A of fixture sheet 2), and the second CNT array 3B is disposed on the other side in the thickness direction of the second resin layer 5B (back face 2B of fixture sheet 2).

Then, the fixture sheet 2 in which the first CNT array 3A and the second CNT array 3B are disposed is heated (heating step).

The heating temperature is a temperature of the melting (softening) temperature of the resin layer 5 (thermoplastic resin) or more, and less than the temperature the resin layer 5 (thermoplastic resin) is burned, and for example, 300° C. or more and 400° C. or less. The heating time is, for example, 1 minute or more, and for example, 30 minutes or less, preferably 10 minutes or less.

In this manner, the resin layer 5 is melted, as shown in FIG. 5A, and the substrate 4-side end portion (one end portion) of the plurality of CNTs 6 of the CNT array 3 is embedded in the resin layer 5 so as to penetrate the corresponding resin layer 5, to contact the substrate 4.

To be specific, the first resin layer 5A melts to embed the other side end portion in the thickness direction of the plurality of CNTs 6 of the first CNT array 3A in the first resin layer 5A so as to penetrate the first resin layer 5A, to contact the front face 4A of the substrate 4. Furthermore, the second resin layer 5B melts to embed the one side end portion in the thickness direction of the plurality of CNTs 6 of the second CNT array 3B in the second resin layer 5B so as to penetrate the second resin layer 5B, to contact the back face 4B of the substrate 4. Meanwhile, the one side end portion in the thickness direction of the plurality of CNTs 6 of the first CNT array 3A is exposed from the first resin layer 5A, and the other side end portion in the thickness direction of the plurality of CNTs 6 of the second CNT array 3B is exposed from the second resin layer 5B.

The melted resin layer 5 closely contact the substrate 4 and the CNT array 3, and enters between the plurality of CNTs 6.

In the heating process, as necessary, the first CNT array 3A and the second CNT array 3B are pressed inward so as to face the substrate 4 from outside in the thickness direction.

The pressure can be 0.1 MPa or more, preferably 0.5 MPa or more, and for example, 1.0 MPa or less.

In this manner, the other side end portion in the thickness direction of the first CNT array 3A, and one side end portion in the thickness direction of the second CNT array 3B make contact with the substrate 4 reliably.

Thereafter, by cooling, the melted resin layer 5 is cured while making contact with the substrate 4 and the CNT array 3. In this manner, the CNT array 3 is fixed to the corresponding resin layer 5, and supported by the fixture sheet 2.

In the above-described manner, the thermal conductive sheet 1 including the fixture sheet 2, and two CNT arrays 3 supported by the fixture sheet 2 is prepared.

Such a thermal conductive sheet 1 preferably has flexibility. In the thermal conductive sheet 1, the thickness direction of the CNT array 3 and the thickness direction of the substrate 4 are the same.

In the thermal conductive sheet 1, before use, the CNTs 6 in the CNT arrays 3 extend along the thickness direction of the substrate 4 (aligned vertically to the substrate 4). In the following, the thermal conductive sheet 1 before use is named a primary thermal conductive sheet 1A.

In the primary thermal conductive sheet 1A, the substrate 4-side end portion of the plurality of CNTs 6 is embedded in the corresponding resin layer 5 to contact the substrate 4, and the non-substrate 4-side end portion of the plurality of CNTs 6 is exposed from the corresponding resin layer 5 to project vertically to be a free end.

Therefore, in the CNT arrays 3, the CNT 6 has embedded portion 6A embedded in corresponding resin layer 5, and projection portion 6B projected from the resin layer 5.

The embedded portion 6A penetrates the corresponding resin layer 5. The length L1 of the embedded portion 6A is, for example, in the range that is the same as the range of the thickness T of the resin layer 5. The percentage of the length L1 of the embedded portion 6A relative to the length L of the CNT 6 as 100%, for example, 5% or more, preferably 10% or more, more preferably 20% or more, and for example, 70% or less, preferably 50% or less.

The projection portion 6B has a length L2 of, for example, 1 μm or more, preferably 10 μm or more, and for example, 400 μm or less, preferably 300 μm or less, more preferably 150 μm or less. The percentage of the length L2 of the projection portion 6B relative to the length L of the CNT 6 as 100% is, for example, 30% or more, preferably 50% or more, and for example, 95% or less, preferably 90% or less, more preferably 80% or less.

The ratio of the length L2 of the projection portion 6B relative to the length L1 of the embedded portion 6A (L2/L1) is, for example, 0.4 or more, preferably 1 or more, and for example, 15 or less, preferably 9 or less, more preferably 4 or less.

When the ratio of the length L1 of the embedded portion 6A is the above-described lower limit or more (when the ratio of the length L2 of the projection portion 6B is the above-described upper limit or less), the resin layer 5 can reliably support the CNT array 3, and in the removing step to be described later, the plurality of CNTs 6 can be suppressed from separating from the fixture sheet 2. When the ratio of the length L2 of the projection portion 6B is the above-described lower limit or more (when the ratio of the length L1 of the embedded portion 6A is the above-described upper limit or less), conformability of the CNT array 3 to an object surface can be improved.

(2) Embodiment of Use of Thermal Conductive Sheet

Figure 5B:
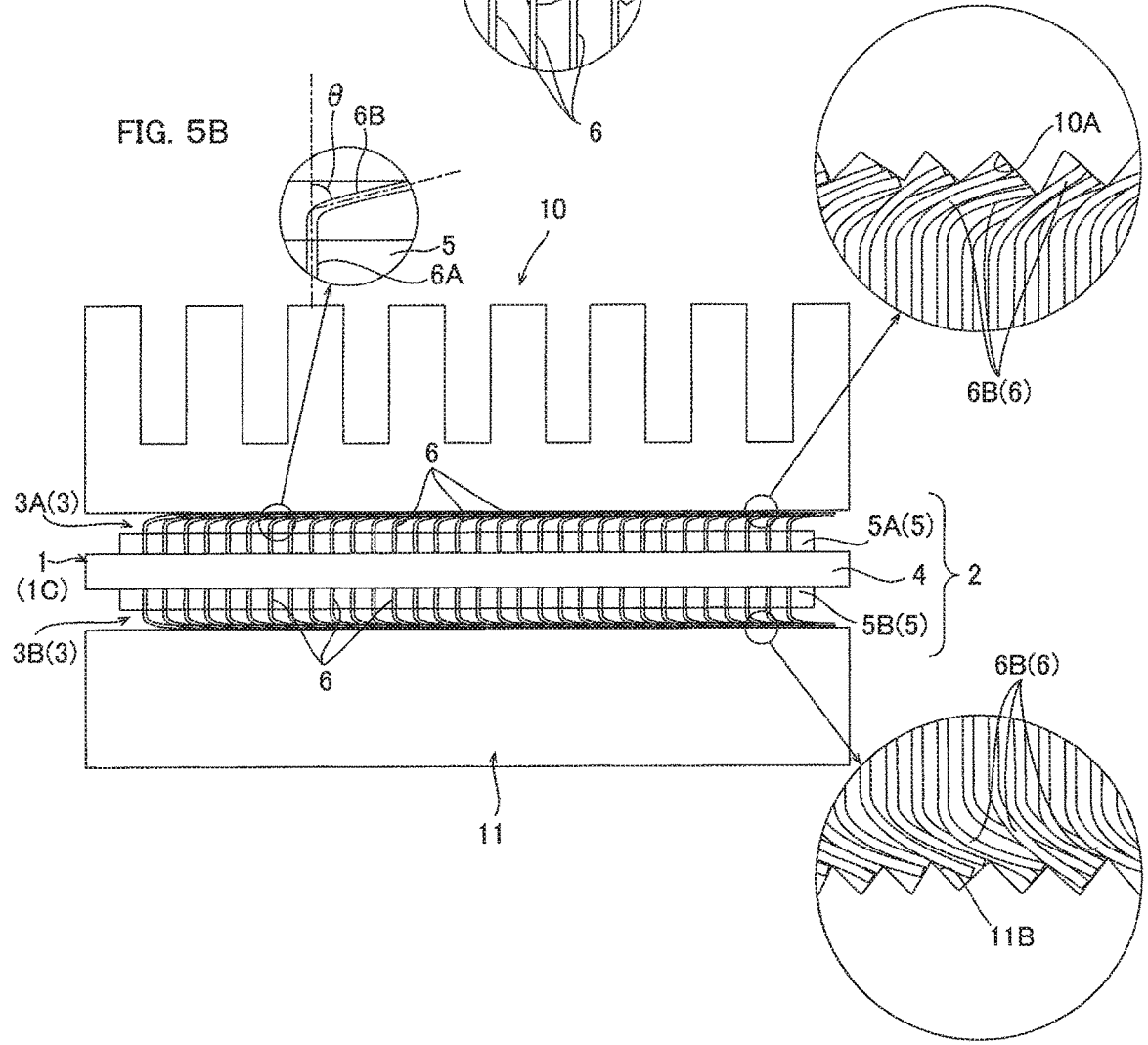
FIG. 5B is a schematic diagram illustrating a state in which the thermal conductive sheet shown in FIG. 5A is disposed between the electronic component and a heat release member.

The thermal conductive sheet 1 (primary thermal conductive sheet 1A) is used as a TIM, as shown in FIG. 5B, for example, by being disposed between the electronic component 11 (object) and the heat release member 10 (object) to be sandwiched in the thickness direction.

Examples of the electronic component 11 include a semiconductor element (IC (integrated circuit) chip, etc.), light-emitting diode (LED), high output laser oscillation element, high output lamp, and power semiconductor element.

Examples of the heat release member 10 include a heat sink and heat spreader.

On the surface 11B of the electronic component 11, and on the surface 10A of the heat release member 10, subtle dents and bumps (surface roughness) are formed. Their surface roughness Rz (10-point average roughness in accordance with JIS B0601-2013) is, for example, 1 μm or more and 10 μm or less.

In the thermal conductive sheet 1, the plurality of CNTs 6 of the first CNT array 3A conforms to the subtle dents and bumps of the surface 10A of the heat release member 10 and are stably in contact with the surface 10A of the heat release member 10. The plurality of CNTs 6 of the second CNT array 3B conform to the subtle dents and bumps of the surface 11B of the electronic component 11, and are stably in contact with the surface 11B of the electronic component 11.

Therefore, when the electronic component 11 generates heat, heat from the electronic component 11 is conducted to the heat release member 10 through the second CNT array 3B, substrate 4, and first CNT array 3A in sequence.

However, when the thermal conductive sheet 1 is used as a TIM, at least a portion of the plurality of CNTs 6 is fallen down so as to lie one above another relative to the fixture sheet 2 by the compression of the electronic component 11 and the heat release member 10.

To be more specific, the CNTs 6 are fallen down so that the free-end portion of the projection portion 6B goes along in the surface direction of the fixture sheet 2 (across the thickness direction of the fixture sheet 2). Then, the fallen projection portion 6B of the plurality of CNTs 6 lies on top of another in the thickness direction of the fixture sheet 2.

The projection portion 6B of the CNT 6 is fallen down so as to bend, relative to the embedded portion 6A, at 60° or less (angle θ), more preferably 80° or less.

The CNT 6 fallen down in the CNT array 3 is, relative to the entire CNT 6 in the CNT array 3, for example, 90% or more and 100% or less.

When the plurality of CNTs 6 are fallen down, a portion of the resin layer 5 entered into the plurality of CNTs 6 are destroyed (ref: FIG. 1C and FIG. 5A).

Then, even if the thermal conductive sheet 1 is separated from between the electronic component 11 and the heat release member 10 for recycle (reuse), as shown in FIG. 1A, at least a portion of the plurality of CNTs 6 is fallen down relative to the fixture sheet 2 so as to lie one above another, and this state is kept.

In the above-described manner, the thermal conductive sheet 1 in which at least a portion of the plurality of CNTs 6 is fallen down relative to the fixture sheet 2 so as to lie one above another is prepared. In the following, the thermal conductive sheet 1 (the thermal conductive sheet 1 after use) in which the plurality of CNTs 6 are fallen down is named a secondary thermal conductive sheet 1B.

(3) Attaching and Removing Adhesive Tape

When the secondary thermal conductive sheet 1B is reused as the TIM, the plurality of CNTs 6 are already fallen down, and therefore the plurality of CNTs 6 cannot conform to the surface roughness of the electronic component 11 and the heat release member 10, which makes contacts between the surface of the electronic component 11 and the heat release member 10 of the plurality of CNTs 6 insufficient, causing gaps between the electronic component 11 and the heat release member 10, and reducing thermal conductivity.

Therefore, when the thermal conductive sheet 1 is reused, the plurality of fallen CNTs 6 are uplifted from the fixture sheet 2.

To be specific, first, as shown in FIG. 1B, the adhesive tape 8 is attached to the CNT array 3 (attaching step).

The adhesive tape 8 is not particularly limited, and a known adhesive tape can be used. Although not shown, the adhesive tape 8 includes a film layer and an adhesive agent layer.

The film layer has a sheet shape. To be specific, the film layer has a predetermined thickness, and extends in a surface direction that is orthogonal to the thickness direction. Examples of the film layer include polyolefin films (for example, polyethylene, polypropylene, ethylene•propylene copolymer, etc.), polyester films (for example, polyethylene terephthalate, polyethylene naphthalate, etc.), polyimide films, and polyamide films (for example, nylon film, etc.). Of these film layers, preferably, polyolefin films and polyimide films are used.

The adhesive agent layer is formed on one side surface of the film layer in the thickness direction. The adhesive agent layer is formed into a layer by a known method from, for example, an adhesive agent (pressure-sensitive adhesive).

The adhesive agent is suitably selected in view of adjusting adhesion force (described later) of the adhesive tape, and for example, acrylic adhesive agent, polyester adhesive agent, silicone adhesive agent, polyamide adhesive agent, and fluorine adhesive agent are used. Of these adhesive agents, preferably, acrylic adhesive agent and silicone adhesive agent are used, and more preferably, silicone adhesive agent is used. The adhesive agent can be used singly, or can be used in combination of two or more.

The adhesive tape 8 has an adhesion force (adhesion force of adhesive tape 8 relative to the stainless steel plate) of, for example, 0.5 N/cm or more, preferably 1.0 N/cm or more, more preferably 2.0 N/cm or more, and for example, 10.0 N/cm or less, preferably 5.0 N/cm or less, more preferably 3.0 N/cm or less.

The adhesion force of the adhesive tape 8 is measured by 90° peel test (method 6 of peel adhesion force test from stainless steel test plate) in conformity with HS Z 0237 (2009). To be specific, adhesion force of the adhesive tape 8 can be measured by attaching an adhesive tape 8 with a width of 24 mm to a stainless steel plate with a pressing roller of 2 kg going back and forth twice under an atmosphere of 23±1° C. and a relative humidity of 50±5%, and then removing the adhesive tape 8 from the stainless steel plate at a removing angle (peeling angle) of 90° and removing speed (tensile speed) of 5.0±0.2 mm/s.

The adhesion force of the adhesive tape 8 is suitably selected so that in the removal step to be described later, the plurality of fallen CNTs 6 can be uplifted without separating from the fixture sheet 2. When the adhesion force of the adhesive tape 8 is the above-described upper limit or less, in the removal step to be described later, the plurality of CNTs 6 can be suppressed from being attached to the adhesive tape 8, and separated from the fixture sheet 2 along with the adhesive tape 8.

Then, the adhesive tape 8 is attached to the CNT array 3 so that the adhesive agent layer of the adhesive tape 8 is attached to the CNT array 3 of the secondary thermal conductive sheet 1B.

To be specific, two adhesive tapes 8 are prepared, and one adhesive tape 8 of the two adhesive tapes 8 is attached to the projection portion 6B of the plurality of CNTs 6 of the first CNT array 3A from one side in the thickness direction. The other adhesive tape 8 of the two adhesive tapes 8 is attached to the projection portion 6B of the plurality of CNTs 6 of the second CNT array 3B from the other side in the thickness direction. The two adhesive tapes 8 can be attached simultaneously to the corresponding CNT array 3, or can be attached sequentially.

At this time, as necessary, a pressure is applied inwardly from outside in the thickness direction (opposite side of the fixture sheet 2) so that the adhesive tape 8 faces the CNT array 3. The pressure (attaching pressure) to the adhesive tape 8 is, for example, 0.1 kg/cm² or more, preferably 0.5 kg/cm² or more, more preferably 1.0 kg/cm² or more, and for example, 10.0 kg/cm² or less, preferably 5.0 kg/cm² or less, more preferably 3.0 kg/cm² or less.

When the attaching pressure is the above-described lower limit or more, in the removal step to be described later, the plurality of fallen CNTs 6 can be reliably uplifted to the fixture sheet 2. When the attaching pressure is the above-described upper limit or less, in the removal step to be described later, attaching of the adhesive agent of the adhesive tape 8 to the plurality of CNTs 6 and contamination of the plurality of CNTs 6 can be suppressed.

The attaching pressure is preferably applied homogeneously to the entire adhesive tape 8.

To apply the attaching pressure to the adhesive tape 8, for example, a known pressing roller is allowed to contact from outside in the thickness direction (opposite side of fixture sheet 2), and allowed to go back and forth on the film layer of the adhesive tape 8 a predetermined number of times (for example, 1 or more and 5 or less).

In this manner, the attaching of the adhesive tape 8 to the CNT array 3 is completed.

Then, as shown in FIG. 1C, the adhesive tape 8 is removed from the CNT array 3 (removal step).

To be specific, after completion of attaching of the adhesive tape 8 to the CNT array 3, for example, within 3 minutes, the end portion of the adhesive tape 8 is held and the removal angle of the adhesive tape 8 is at a predetermined range, the end portion of the adhesive tape 8 is pulled so as to go away from the fixture sheet 2. In this manner, two adhesive tapes 8 are removed from the first CNT array 3A and the second CNT array 3B. The two adhesive tapes 8 can be removed from the corresponding CNT arrays 3 simultaneously, or can be removed from the corresponding CNT array 3 sequentially.

At this time, the removal angle (peeling angle) of the adhesive tape 8 is not particularly limited, and for example, 45° or more, preferably 70° or more, and for example, 180° or less, preferably 120° or less.

When the removal angle is within the above-described range, the plurality of fallen CNTs 6 are reliably uplifted from the fixture sheet 2. The removal angle is an angle formed by the removed adhesive tape 8 relative to the surface direction of the fixture sheet 2.

The removal speed of the adhesive tape 8 (tensile speed of end portion of adhesive tape 8) is not particularly limited, and for example, 0.1 mm/s or more, preferably 1 mm/s or more, more preferably 5 mm/s or more, and for example, 50 mm/s or less, preferably 15 mm/s or less.

When the removal speed is the above-described lower limit or more, working efficiency of the removal step can be improved. When the removal speed is the above-described upper limit or less, the adhesive tape 8 can be removed from the CNT array 3 stably.

The plurality of fallen CNTs 6 in the secondary thermal conductive sheet 1B is uplifted relative to the fixture sheet 2 along with the removal from the CNT array 3 of the adhesive tape 8 without substantially separated from the fixture sheet 2. That is, the plurality of CNTs 6 are uplifted again from the fixture sheet 2 by the above-described method for uplifting a plurality of carbon nanotubes.

The CNT array 3 separated from the fixture sheet 2 relative to the entire CNT array 3 is, preferably 10% or less, more preferably 5% or less. The removal step is performed, particularly preferably so that the CNT array 3 separated from the fixture sheet 2 is 0% as much as possible relative to the entire CNT array 3.

In the following, the thermal conductive sheet 1, in which the plurality of fallen CNTs 6 of the secondary thermal conductive sheet 1B are uplifted relative to the fixture sheet 2 by the above-described method for uplifting a plurality of carbon nanotubes, is named a tertiary thermal conductive sheet 1C.

The tertiary thermal conductive sheet 1C (thermal conductive sheet 1) includes, as shown in FIG. 1D, the fixture sheet 2, and the CNT array 3, in which the plurality of CNTs 6 are aligned in a predetermined direction (thickness direction of fixture sheet 2), and the plurality of CNTs 6 are uplifted from the fixture sheet 2 by allowing at least a portion of the plurality of CNTs 6 to fall down relative to the fixture sheet 2 so as to lie one above another, and attaching the adhesive tape 8 to the CNT array 3, and removing therefrom.

That is, the plurality of CNTs 6 in the CNT arrays 3 is once fallen down, and thereafter uplifted so as to extend along the thickness direction of the fixture sheet 2. The plurality of CNTs 6 of the tertiary thermal conductive sheet 1C are uplifted from the plurality of CNTs 6 of the primary thermal conductive sheet 1A by, for example, ±30°.

In the tertiary thermal conductive sheet 1C, as shown in FIG. 1C, the plurality of CNTs 6 are once fallen down, and therefore compared with the primary thermal conductive sheet 1A, the plurality of CNTs 6 uplifted from the fixture sheet 2 are increased, and characteristics of the thermal conductive sheet 1 are improved.

Furthermore, in the tertiary thermal conductive sheet 1C, a portion of the resin layer 5 entered into the plurality of CNTs 6 is damaged, and the plurality of CNTs 6 loosened. Therefore, flexibility of the plurality of CNTs 6 of the tertiary thermal conductive sheet 1C improves compared with the primary thermal conductive sheet 1A, and conformability to the object improves.

Therefore, the tertiary thermal conductive sheet 1C can be reused as the TIM, as shown in FIG. 5B, and the plurality of CNTs 6 can conform to subtle dents and bumps of the surface 10A of the heat release member 10 and surface 11B of the electronic component 11.

(4) Operations and Effects

In the thermal conductive sheet 1, as shown in FIG. 1A, one end portion of the plurality of CNTs 6 of the CNT array 3 removed from the growth substrate 15 is embedded in the fixture sheet 2, and therefore adhesion force between the fixture sheet 2 and the CNT 6 can be improved.

Therefore, even if at least a portion of the plurality of CNTs 6 is fallen down to the fixture sheet 2 so as to lie one above another, as shown in FIG. 1B and FIG. 1C, by attaching the adhesive tape 8 to the CNT array 3 and removing the adhesive tape 8 from the CNT array 3, the plurality of CNTs 6 can be suppressed from being separated from the fixture sheet 2, and the plurality of CNTs 6 can be uplifted from the fixture sheet 2.

That is, with an easy method, the plurality of CNTs 6 fallen down to the fixture sheet 2 so as to lie one above another can be uplifted from the fixture sheet 2.

Second Embodiment

Next, description is given below of the second embodiment of the present invention with reference to FIG. 6A to FIG. 6C. In the second embodiment, the same reference numerals are given to those members that are the same as those in the first embodiment, and description thereof is omitted.

Figure 6A:
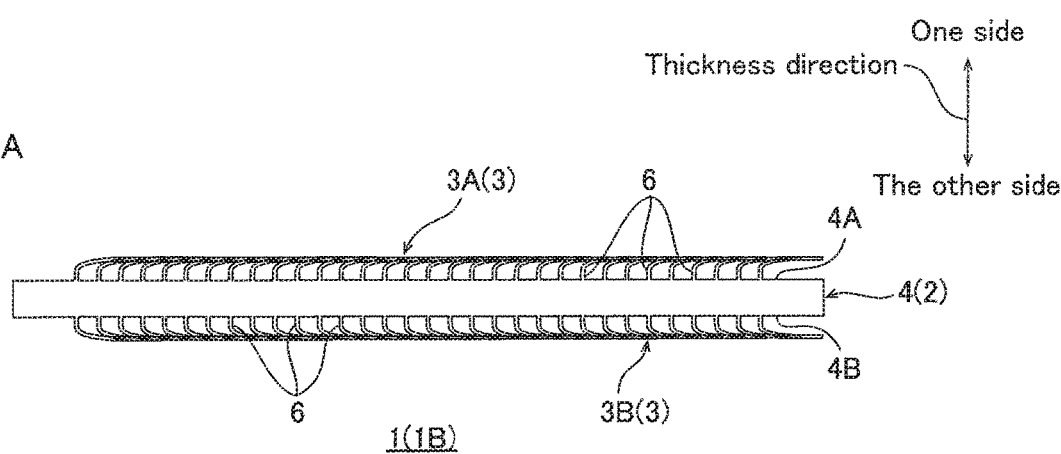
FIG. 6A illustrates a second embodiment of the method for uplifting a carbon nanotube structure of the present invention, showing a step of preparing a thermal conductive sheet, in which the plurality of CNTs are fallen down relative to the fixture sheet.

In the second embodiment, as shown in FIG. 6A, the fixture sheet 2 is composed only of the substrate 4, and the plurality of CNTs 6 of the CNT array 3 are bonded to the interface of the substrate 4. To be specific, the first CNT array 3A is disposed at the front face 4A of the substrate 4 and the other side end portion in the thickness direction of (one end portion) of the plurality of CNTs 6 of the first CNT array 3A is bonded to the front face 4A of the substrate 4. The second CNT array 3B is disposed at the front face 4A of the substrate 4, and one side end portion in the thickness direction of the (one end portion) of the plurality of CNTs 6 of the second CNT array 3B is bonded to the back face 4B of the substrate 4.

That is, the thermal conductive sheet 1 includes the substrate 4 (an example of fixture sheet), and two CNT arrays 3. In the second embodiment, the substrate 4 is a metal sheet or a ceramic sheet.

To prepare the thermal conductive sheet 1, for example, first, the above-described metal is vapor deposited on one side surfaces of the two CNT arrays 3 by known methods.

Then, the CNT array 3 is disposed on both sides of the front face 4A and the back face 4B of the substrate 4 so that the metal vapor deposited surface of the CNT array 3 make contact with the substrate 4.

Then, the substrate 4 on which the CNT array 3 is disposed is heated under vacuum or inert atmosphere.

The heating temperature is, for example, 1000° C. or more, preferably 1500° C. or more, and for example, 2500° C. or less, preferably 2000° C. or less. The heating time is, for example, 1 minute or more, and for example, 60 minutes or less, preferably 30 minutes or less.

In this manner, the plurality of CNTs 6 of the CNT array 3 are bonded to the substrate 4. Thereafter, by cooling, the thermal conductive sheet 1 is prepared.

When such a thermal conductive sheet 1 is used, similarly to the first embodiment, as the TIM (ref: FIG. 5B), at least a portion of the plurality of CNTs 6 are fallen down relative to the substrate 4 so as to lie one above another, as shown in FIG. 6A.

To be more specific, the CNTs 6 are fallen down so that the free-end portion of the CNT 6 is along the surface direction of the fixture sheet 2 (to cross the thickness direction of the fixture sheet 2). The fallen down portion of the CNT 6 (free-end portion) is bent and fallen down relative to the thickness direction of the substrate 4 to form an angle of 60° or less, or preferably 80° or less.

Figure 6B:
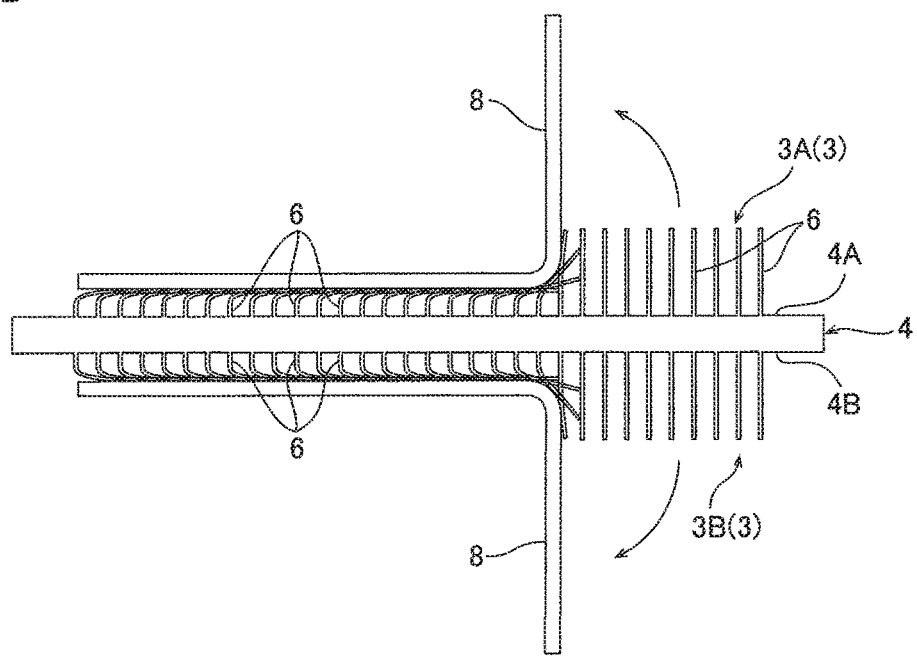
FIG. 6B shows, following FIG. 6A, a step of attaching the adhesive tape to the CNT array, and removing the adhesive tape from the CNT array.
Figure 6C:
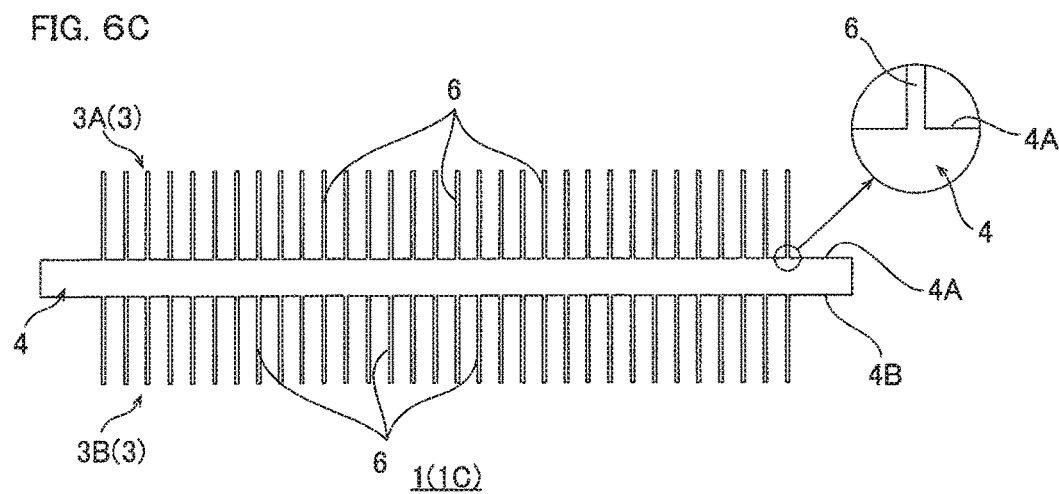
FIG. 6C shows a thermal conductive sheet, in which the plurality of CNTs are uplifted relative to the fixture sheet by the step shown in FIG. 6B.

Therefore, when the thermal conductive sheet 1 is recycled (reused), as shown in FIG. 6B and FIG. 6C, in the same manner as in the first embodiment, the adhesive tape 8 is attached to the CNT array 3 (attaching step), and then the adhesive tape 8 is removed from the CNT array 3 (removal step).

In this manner, the plurality of fallen CNTs 6 are uplifted from the substrate 4 without being separated from the substrate 4. Therefore, such a second embodiment also achieves the same operations and effects as the above-described first embodiment.

Third Embodiment

Next, description is given below of the third embodiment of the present invention with reference to FIG. 7A to FIG. 7C. In the third embodiment, the same reference numerals are given to those members that are the same as those in the first embodiment, and description thereof is omitted.

Figure 7A:
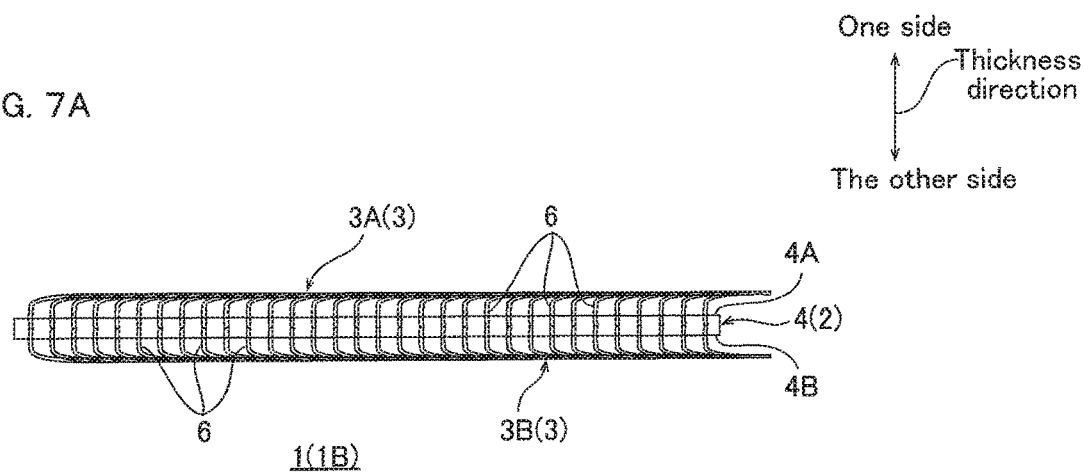
FIG. 7A illustrates a third embodiment of the method for uplifting a carbon nanotube structure of the present invention, showing a step of preparing a thermal conductive sheet, in which the plurality of CNTs are fallen down relative to the fixture sheet.

In the third embodiment, as shown in FIG. 7A, the two CNT arrays 3 are in contact with each other in the substrate 4 (an example of the fixture sheet). To be specific, the other side end portion in the thickness direction of (one end portion) of the plurality of CNTs 6 of the first CNT array 3A is embedded in the front face 4A of the substrate 4, and one side end portion in the thickness direction of the (one end portion) of the plurality of CNTs 6 of the second CNT array 3B is embedded in the back face 4B of the substrate 4. Then, the other side end portion in the thickness direction of the plurality of CNTs 6 of the first CNT array 3A are in contact with one side end portion in the thickness direction of the plurality of CNTs 6 of the second CNT array 3B in the substrate 4. Meanwhile, one side end portion in the thickness direction of the plurality of CNTs 6 of the first CNT array 3A and the other side end portion in the thickness direction of the plurality of CNTs 6 of the second CNT array 3B are exposed from the substrate 4.

In the third embodiment, the substrate 4 is a metal sheet or a resin sheet.

To prepare the thermal conductive sheet 1 in this embodiment, for example, when the substrate 4 is a metal sheet, first, a resin paste in which the above-described metal particles are dispersed is applied on one of the two CNT arrays 3. Then, two CNT arrays 3 are disposed so as to sandwich the resin paste.

Then, the two CNT arrays 3 sandwiching the resin paste is heated under vacuum or inert atmosphere.

The heating temperature and heating time ranges are same as the heating temperature and heating time ranges in the above-described second embodiment.

In this manner, the resin material contained in the resin paste is burned, and the metal particles are melted to go between the plurality of CNTs 6 of the CNT array 3.

Then, the substrate 4 is formed as the metal sheet, and the two CNT arrays 3 are embedded in the substrate 4, and make contact with each other in the substrate 4. Thereafter, by cooling, the thermal conductive sheet 1 is prepared.

When the substrate 4 is a resin sheet, to prepare the thermal conductive sheet 1, for example, the CNT array 3 is disposed on both of the front face 4A and the back face 4B of the substrate 4, and the substrate 4 on which the CNT array 3 is disposed is heated. The heating temperature is, for example, 300° C. or more and 400° C. or less. The heating time is, for example, 1 minute or more and 10 minutes or less.

In this manner as well, the two CNT arrays 3 are embedded in the substrate 4, and make contact with each other in the substrate 4. Therefore, the thermal conductive sheet 1 can be prepared. The substrate 4 (resin sheet) may or may not contain the above-described electroconductive particles.

When the thermal conductive sheet 1 is used as the TIM (ref: FIG. 5B) as in the first embodiment, at least a portion of the plurality of CNTs 6 are fallen down so as to lie one above another relative to the substrate 4 as in the second embodiment, as shown in FIG. 7A.

Figure 7B:
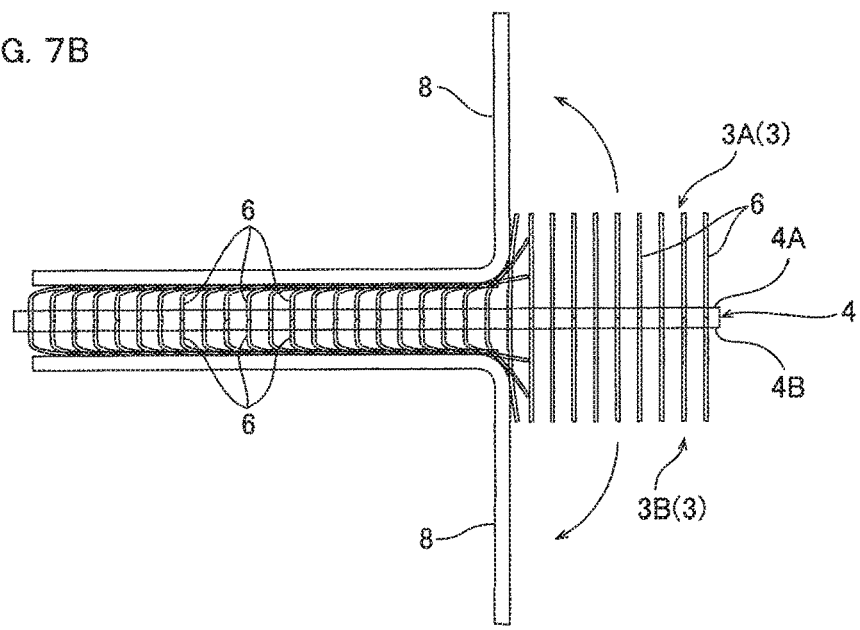
FIG. 7B shows, following FIG. 7A, a step of attaching the adhesive tape to the CNT array, and removing the adhesive tape from the CNT array.
Figure 7C:
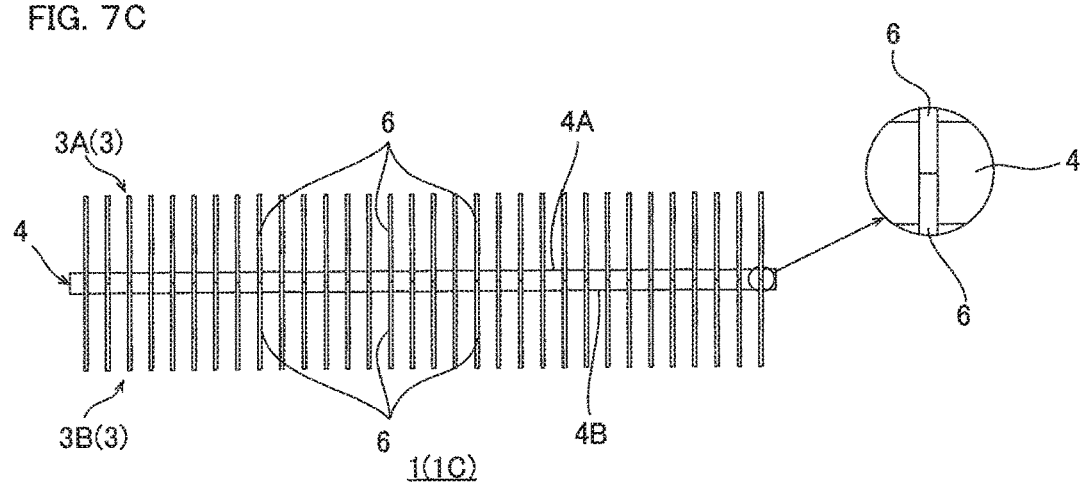
FIG. 7C shows a thermal conductive sheet, in which the plurality of CNTs are uplifted relative to the fixture sheet by the step shown in FIG. 7B.

Therefore, when the thermal conductive sheet 1 is recycled (reused), as shown in FIG. 7B and FIG. 7C, the adhesive tape 8 is attached to the CNT array 3 (attaching step), and then the adhesive tape 8 is removed from the CNT array 3 (removal step) in the same manner as in the first embodiment.

In this manner, the plurality of fallen CNTs 6 are uplifted from the substrate 4 without being separated from the substrate 4. Therefore, such a third embodiment also achieves the same operations and effects as the above-described first embodiment.

Fourth Embodiment

Next, description is given below of the fourth embodiment of the present invention with reference to FIG. 8A to FIG. 8C. In the fourth embodiment, the same reference numerals are given to those members that are the same as those in the first embodiment, and description thereof is omitted.

In the first embodiment to the third embodiment, in the thermal conductive sheet 1, the plurality of CNTs 6 (CNT array 3) are embedded in or bonded to both of the front face and the back face of the fixture sheet (fixture sheet 2 or substrate 4), but it is not limited thereto.

Figure 8A:
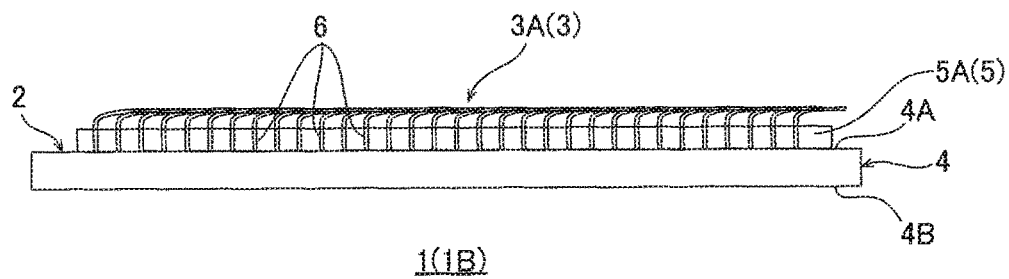
FIG. 8A illustrates a fourth embodiment of the method for uplifting a carbon nanotube structure of the present invention, showing a step of preparing a thermal conductive sheet, in which the plurality of CNTs are fallen down relative to the fixture sheet.

In the fourth embodiment, in the thermal conductive sheet 1, as shown in FIG. 8A, the plurality of CNTs 6 (CNT array 3) are embedded in or bonded to only one of the front face 2A and back face 2B of the fixture sheet 2. The substrate 4-side end portion in the plurality of CNTs 6 is embedded in the resin layer 5 to contact the substrate 4, and the non-substrate 4-side end portion in the plurality of CNTs 6 is exposed from the resin layer 5.

In the case of such a thermal conductive sheet 1 as well, when used as the TIM (ref: FIG. 5B), at least a portion of the plurality of CNTs 6 is fallen down so as to lie one above another relative to the fixture sheet 2 in the same manner as in the first embodiment.

Figure 8B:
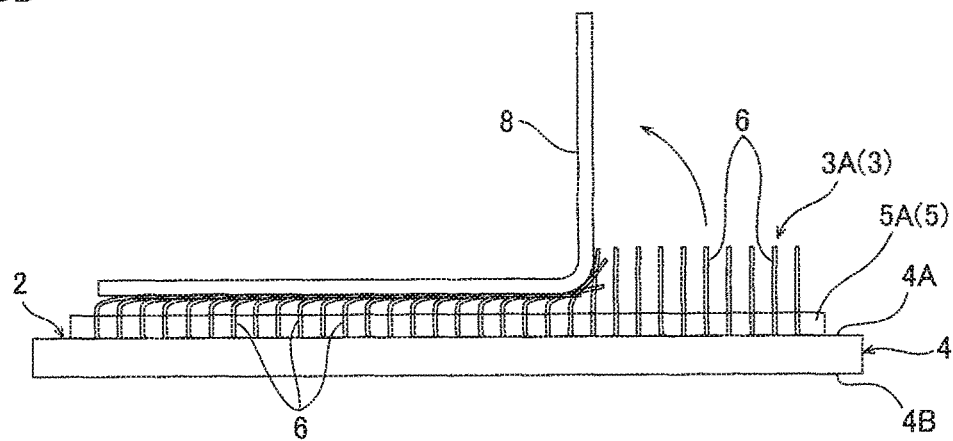
FIG. 8B shows, following FIG. 8A, a step of attaching the adhesive tape to the CNT array, and removing the adhesive tape from the CNT array.
Figure 8C:
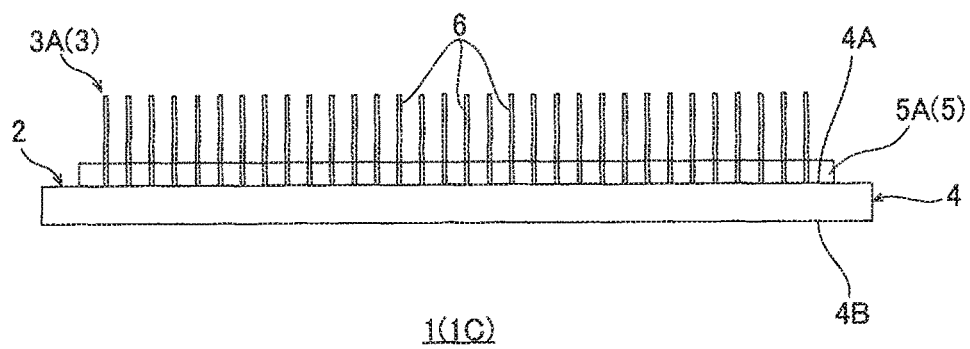
FIG. 8C shows a thermal conductive sheet, in which the plurality of CNTs are uplifted relative to the fixture sheet by the step shown in FIG. 8B.

Therefore, when the thermal conductive sheet 1 is recycled (reused), as shown in FIG. 8B and FIG. 8C, in the same manner as in the first embodiment, the adhesive tape 8 is attached to the CNT array 3 (attaching step), and then the adhesive tape 8 is removed from the CNT array 3 (removal step).

In this manner, the plurality of fallen CNTs 6 are uplifted relative to the fixture sheet 2 without being separated from the fixture sheet 2. Therefore, such a fourth embodiment also achieves the same operations and effects as the above-described first embodiment.

Fifth Embodiment and Sixth Embodiment
(Maintenance Method of Conveyer Belt)

Next, description is given below of the fifth embodiment and sixth embodiment of the present invention with reference to FIG. 9A and FIG. 9B. In the fifth embodiment and sixth embodiment, the same reference numerals are given to those members that are the same as those in the first embodiment, and description thereof is omitted.

In the first embodiment to fourth embodiment, the CNT structure is used as the thermal conductive sheet 1, but the CNT structure is not limited thereto.

In the fifth embodiment and the sixth embodiment, the CNT structure is a conveyer belt 30, and the conveyer belt 30 is included in a conveyer unit 29, which conveys a component 50 as an example of the object.

Figure 9A:
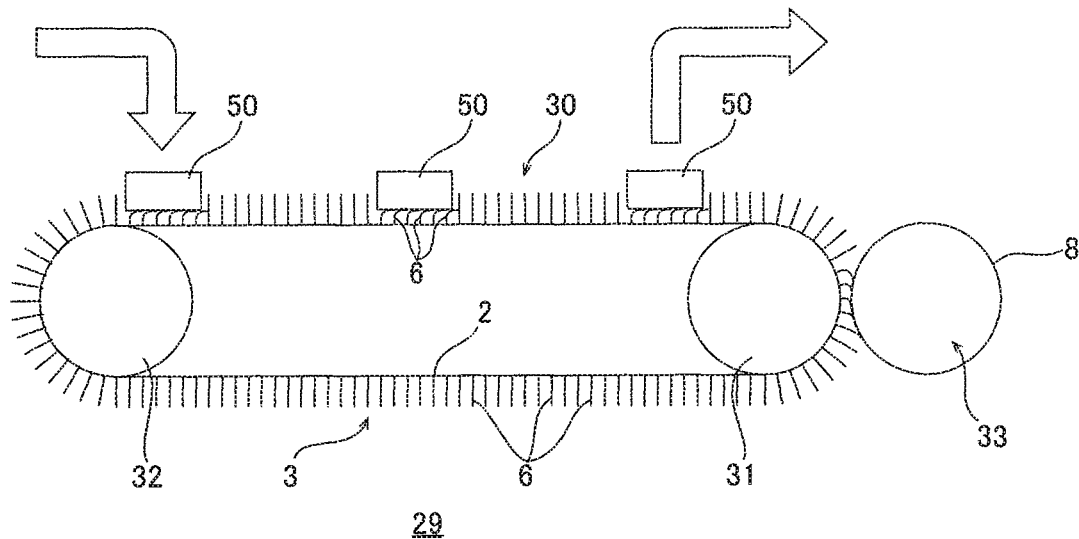
FIG. 9A illustrates a fifth embodiment of the method for uplifting a carbon nanotube structure of the present invention.

In the fifth embodiment, the conveyer unit 29 includes, as shown in FIG. 9A, a first roller 31, a second roller 32, a conveyer belt 30, and a pressure sensitive adhesion roller 33.

The first roller 31 and the second roller 32 are disposed in spaced apart relation from each other.

The conveyer belt 30 is an endless belt, and is passed around the first roller 31 and the second roller 32. The conveyer belt 30 goes around by rotation of the first roller 31 and second roller 32.

The conveyer belt 30 includes a fixture sheet 2 of an endless belt, and a CNT array 3 disposed at the outer peripheral surface of the fixture sheet 2.

The CNT array 3 includes the plurality of CNTs 6, and the plurality of CNTs 6 extend in the thickness direction of the fixture sheet 2. The fixture sheet 2-side end portion (one end portion) of the plurality of CNTs 6 are embedded in or bonded to the outer peripheral surface of the fixture sheet 2, and the opposite-side end portion of the plurality of CNTs 6 is projected vertically to be a free end.

That is, the conveyer belt 30 is formed into an endless belt from the CNT structure shown in the fourth embodiment.

The pressure sensitive adhesion roller 33 is disposed in slightly spaced apart relation from the first roller 31 at the opposite side of the second roller 32. Around the surface of the pressure sensitive adhesion roller 33, the adhesive tape 8 is wound around. In the adhesive tape 8 wound around the pressure sensitive adhesion roller 33, the adhesive agent layer of the adhesive tape 8 is positioned at outside in the diameter direction of the pressure sensitive adhesion roller 33 relative to the film layer.

The configuration is made so that the circularly moving conveyer belt 30 passes between the pressure sensitive adhesion roller 33 and the first roller 31, and to the CNT array 3 of the conveyer belt 30, the adhesive tape 8 is attached when the conveyer belt 30 passes between the pressure sensitive adhesion roller 33 and the first roller 31.

In the conveyer unit 29, the component 50 is conveyed.

To be specific, the component 50 is disposed on the conveyer belt 30 at the conveyance start position. At this time, the component 50 contacts the plurality of CNTs 6, and the plurality of CNTs 6 are fallen down so as to lie one above another relative to the fixture sheet 2 by the contact with the component 50. In this manner, the position of the component 50 is fixed (adhered) relative to the conveyer belt 30.

Then, the component 50 is conveyed from the conveyance start position to the target position along with the circular motion of the conveyer belt 30, and then picked up from the conveyer belt 30, and separated.

However, even if the component 50 is separated, the plurality of CNTs 6 are kept in the fallen down state. In the above-described manner, a conveyer belt 30, in which at least a portion of the plurality of CNTs 6 are fallen down so as to lie one above another relative to the fixture sheet 2, is prepared.

When the component 50 is to be conveyed again by the conveyer belt 30, and the component 50 is disposed on the already fallen down plurality of CNTs 6, the plurality of CNTs 6 make insufficient contact with the component 50, and the position of the component 50 cannot be reliably fixed (adhered) relative to the conveyer belt 30.

Meanwhile, in the conveyer unit 29, the plurality of fallen CNTs 6 pass between the first roller 31 and the pressure sensitive adhesion roller 33 along with the circular motion of the conveyer belt 30. At this time, to the CNT array 3 of the conveyer belt 30, the adhesive tape 8 of the pressure sensitive adhesion roller 33 is attached (attaching step), and then by the movement of the conveyer belt 30, and the adhesive tape 8 is removed (removal step).

In this manner, the plurality of fallen CNTs 6 are uplifted relative to the fixture sheet 2 without being separated from the fixture sheet 2. That is, the plurality of CNTs 6 are uplifted relative to the fixture sheet 2 by the above-described method for uplifting a plurality of carbon nanotubes. Therefore, maintenance of the conveyer belt 30 can be performed continuously and smoothly.

Therefore, in the conveyer unit 29, when the component 50 is conveyed again, contact between the plurality of CNTs 6 and the component 50 can be reliably secured, and the position of the component 50 can be reliably fixed (adhered) relatively to the conveyer belt 30.

Figure 9B:
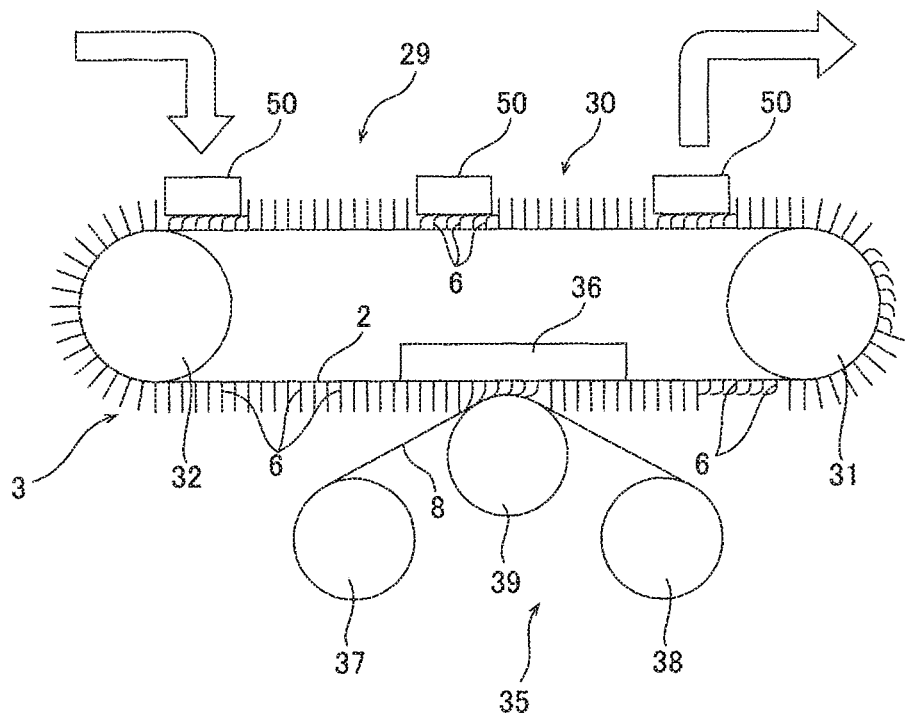
FIG. 9B illustrates a sixth embodiment of the method for uplifting a carbon nanotube structure of the present invention.

In the sixth embodiment, the conveyer unit 29 includes, as the shown in FIG. 9B, a pressure sensitive adhesion unit 35 instead of the pressure sensitive adhesion roller 33. In the sixth embodiment, the same reference numerals are given to those members that are the same as those in the fifth embodiment above, and description thereof is omitted.

The pressure sensitive adhesion unit 35 includes a plate 36, a pressing roller 39, a feeder rod 37, and a take-up rod 38.

The plate 36 is disposed between the first roller 31 and the second roller 32. The plate 36 is disposed inside the conveyer belt 30 so as to face the inner periphery of the conveyer belt 30 (fixture sheet 2).

The pressing roller 39 is disposed slightly spaced apart from the conveyer belt 30 at the opposite side of the plate 36. In this manner, the configuration is made so that the circularly moving conveyer belt 30 passes between the plate 36 and the pressing roller 39.

the feeder rod 37 is disposed in spaced apart relation from the pressing roller 39. An elongated adhesive tape 8 is wound around the feeder rod 37 a plurality of times in spiral. In the adhesive tape 8 wound around the feeder rod 37, the adhesive agent layer of the adhesive tape 8 is positioned outside in the diameter direction of the feeder rod 37 relative to the film layer.

The take-up rod 38 is disposed in spaced apart relation in the circumferential direction of the pressing roller 39 relative to the feeder rod 37.

Then, in the pressure sensitive adhesion unit 35, the configuration is made so that the adhesive tape 8 taken out from the feeder rod 37 is arranged so as to pass the peripheral surface pressing roller 39, and then taken by the rotation of the take-up rod 38. In this manner, to the CNT array 3 of the conveyer belt 30, the adhesive tape 8 is attached when the conveyer belt 30 passes between the plate 36 and the pressing roller 39.

In the conveyer unit 29, by conveyance of the component 50, the plurality of fallen CNTs 6 pass between the plate 36 and the pressing roller 39 along with the circular motion of the conveyer belt 30. At this time, the CNT array 3 of the conveyer belt 30 is attached to the adhesive tape 8 taken out from the feeder rod 37 (attaching step), and then removed from the adhesive tape 8 by the circular motion of the conveyer belt 30 (removal step).

In this manner, the plurality of fallen CNTs 6 are uplifted relative to the fixture sheet 2 without being separated from the fixture sheet 2. Therefore, in the sixth embodiment as well, the maintenance of the conveyer belt 30 can be performed continuously and smoothly.

Seventh Embodiment (Method for Producing Thermal Conductive Sheet)

In the first embodiment to fourth embodiment, for example, as shown in FIG. 1A to FIG. 1D, the method for uplifting a plurality of carbon nanotubes of the present invention is used for recycling (reuse) of the thermal conductive sheet 1, and in the fifth embodiment and sixth embodiment, as shown in FIG. 9A and FIG. 9B, the method for uplifting a plurality of carbon nanotubes of the present invention is used for the maintenance of the conveyer belt 30, but it is not limited thereto.

For example, in view of improvement in characteristics of the thermal conductive sheet 1, the plurality of CNTs 6 of the primary thermal conductive sheet 1A are fallen down once to prepare the secondary thermal conductive sheet 1B, and thereafter it is attached to the CNT array 3 of the secondary thermal conductive sheet 1B, and removing the adhesive tape 8, the tertiary thermal conductive sheet 1C can be produced.

In the tertiary thermal conductive sheet 1C, as described above, and as shown in FIG. 1C, a portion of the resin layer 5 entered into the plurality of CNTs 6 is damaged, and the plurality of CNTs 6 are loosened, and conformability to an object is improved. That is, the tertiary thermal conductive sheet 1C with improved conformability can be produced as a new (final) product.

To produce the tertiary thermal conductive sheet 1C, as shown in FIG. 5A, the primary thermal conductive sheet 1A is prepared in the same manner as in the first embodiment.

In the first embodiment, as shown in FIG. 5B, the primary thermal conductive sheet 1A is used as the TIM, and at least a portion of the plurality of CNTs 6 are fallen down. But in the seventh embodiment, the CNT array 3 of the primary thermal conductive sheet 1A is intentionally pressed from outside in the thickness direction, to allow at least a portion of the plurality of CNTs 6 to fall down so as to lie one above another relative to the fixture sheet 2 (falling down step). The falling down step includes the case where the CNT array 3 is fallen down so as to lie one above another at the time of embedded in or bonded to the fixture sheet 2.

The pressure can be 0.5 MPa or more, preferably 1.0 MPa or more, and for example, 4.0 MPa or less.

In this manner, the secondary thermal conductive sheet 1B is prepared.

Then, in the same manner as in the first embodiment, as shown in FIG. 1B and FIG. 1C, the adhesive tape 8 is attached to the CNT array 3 of the secondary thermal conductive sheet 1B (attaching step), and then the adhesive tape 8 is removed from the CNT array 3 (removal step).

In this manner, the plurality of CNTs 6 of the CNT array 3 are uplifted relative to the fixture sheet 2. In the above-described manner, the thermal conductive sheet 1 (tertiary thermal conductive sheet 1C) is produced.

The tertiary thermal conductive sheet 1C is produced by allowing at least a portion of the plurality of CNTs 6 of the primary thermal conductive sheet 1A to fall down relative to the fixture sheet 2 so as to lie one above another, and then attaching the adhesive tape 8 to the CNT array 3, and removing the adhesive tape 8 from the CNT array 3, to uplift the plurality of CNTs 6 relative to the fixture sheet 2.

Therefore, in the tertiary thermal conductive sheet 1C, compared with the primary thermal conductive sheet 1A, the plurality of CNTs 6 are uplifted sufficiently and reliably relative to the fixture sheet 2. In the tertiary thermal conductive sheet 1C, as described above, conformability to the object is improved.

Therefore, in the seventh embodiment, the thermal conductive sheet 1 with sufficient desired characteristics and improved conformability to the object can be produced with an easy method. The conveyer belt 30 can also be produced in the same manner as in the seventh embodiment.

Preferably, the following sequence of steps are conducted a plurality of times: a step of allowing at least a portion of the plurality of CNTs 6 of the thermal conductive sheet 1 to fall down relative to the fixture sheet 2 so as to lie one above another (falling down step), a step of attaching the adhesive tape 8 to the CNT array 3 (attaching step), and a step of removing the adhesive tape 8 from the CNT array 3 (removal step). The sequence of steps includes a step of falling down, a step of attaching, and a step of removing, and in the sequence of steps, the falling down step, attaching step, and removal step are sequentially performed. Examples of the repeating time include, for example, twice or more and 10 times or less. With this method, the plurality of CNTs 6 are reliably uplifted relative to the fixture sheet 2, and flexibility can be improved.

Eighth Embodiment

Next, description is given below of the eighth embodiment of the present invention with reference to FIG. 10A to FIG. 10C. In the eighth embodiment, the same members as those in the first embodiment above are given the same reference numerals, and descriptions thereof are omitted.

In the first embodiment to seventh embodiment, the end portion of the plurality of CNTs 6 is embedded in or bonded to the fixture sheet (fixture sheet 2 or substrate 4), but it is not limited thereto. In the present invention, at least a portion of the plurality of CNTs is embedded in or bonded to the fixture sheet.

In the eighth embodiment, as shown in FIG. 10A, the plurality of CNTs 6 in the CNT array 3 penetrate the substrate 4 (an example of the fixture sheet), and the center portion of the plurality of CNTs 6 (portion between one end portion and the other end portion in the thickness direction) are embedded in the substrate 4. The range of the percentage of the length of the embedded portion 6A embedded in the substrate 4 is the same as the range of the length L1 of the above-described embedded portion 6A. The one end portion and the other end portion of the plurality of CNTs 6 are exposed from the substrate 4. In the eighth embodiment, for the substrate 4, for example, a metal sheet, a thermoplastic resin sheet, and a thermosetting resin sheet are used.

When the CNT structure is used as the TIM (ref: FIG. 5B) as in the first embodiment, at least a portion of the plurality of CNTs 6 is fallen down so as to lie one above another relative to the fixture sheet 2.

Therefore, when the CNT structure is recycled (reused), as shown in FIG. 10B and FIG. 10C, in the same manner as in the first embodiment, the adhesive tape 8 is attached to the CNT array 3 (attaching step), and the adhesive tape 8 is removed from the CNT array 3 (removal step).

In this manner, the plurality of fallen CNTs 6 are uplifted from the substrate 4 without being separated from the substrate 4. Therefore, the eighth embodiment can also achieve the above-described operations and effects of the first embodiment.

Modified Example

In the first embodiment, the resin layer 5 is formed from thermoplastic resin in the fixture sheet preparation step, but when the resin layer 5 is formed from thermosetting resin, first, uncured resin composition is prepared in correspondence with the above-described thermosetting resin. The uncured resin composition is a liquid and in A-stage state. For the thermosetting resin, preferably, epoxy resin and fluorine rubber is used.

Then, the resin composition is applied on both of the front face 4A and the back face 4B of the substrate 4, to form the resin composition layer on both of the front face 4A and the back face 4B of the substrate 4. Thereafter, the resin composition layer keeps its A-stage state, or the resin composition layer is brought into semi-cured B-stage state.

Then, the CNT array 3 is embedded in both front side and back side of the resin composition layer to allow the substrate 4-side end portion of the CNT array 3 to contact the substrate 4. Thereafter, heating is conducted to a predetermined curing temperature to cure (completely cure) the resin composition layer to form a C-stage state resin layer 5. The thermal conductive sheet 1 (primary thermal conductive sheet 1A) is prepared in this manner as well.

It is also possible to form the resin composition layer on the front face 4A of the substrate 4, embed the CNT array 3 on the resin composition layer of the front side, cure the resin composition layer to form the resin layer 5, and then form the resin composition layer on the back face 4B of the substrate 4, embed the CNT array 3 on the resin composition layer on the back side, and cure the resin composition layer to form the resin layer 5. The resin composition layer can also be formed by attaching a B-stage state prepreg sheet to the substrate 4.

In the first embodiment, the CNT array 3 is densified by heating and liquid supply. However, the CNT array 3 densification is not limited thereto, and the CNT array 3 can be densified by mechanical compression.

In the above-described first embodiment to eighth embodiment, the CNT structure is the thermal conductive sheet or the conveyer belt, but use of the CNT structure is not limited thereto, and for example, it can be used as a vibration isolator and heat insulating material.

The first embodiment to eighth embodiment, and modified example can be suitably combined.

EXAMPLES

The present invention is further described in detail based on EXAMPLES below. But the present invention is not limited to these Examples. The specific numerical values of mixing ratio (content), physical property value, and parameter used in the description below can be replaced with the upper limit values (numerical values defined with "or less" or "below") or lower limit values (numerical values defined with "or more" or "more than") of the corresponding numerical values of mixing ratio (content), physical property value, and parameter described in "DESCRIPTION OF EMBODIMENTS" above.

Preparation Example 1

A silicon dioxide film was stacked on the surface of the stainless steel-made growth substrate (stainless steel substrate), and thereafter iron was vapor deposited as a catalyst layer on the silicon dioxide film.

Then, the growth substrate was heated to 600° C., and a source gas (acetylene gas) was supplied to the catalyst layer for 10 minutes. In this manner, the VACNTs having a rectangular shape in plan view was formed on the growth substrate.

In the VACNTs, the CNTs extend in substantially parallel to each other, and aligned (vertical alignment) orthogonal to the growth substrate. The CNT is a multi-walled carbon nanotube, has an average external diameter of about 12 nm, and an average length of CNT of about 150 µm. The VACNTs has a bilk density of about 50 mg/cm$^3$.

Then, the cutter blade (cutting blade) was shifted along the growth substrate, and the VACNTs were cut out from the growth substrate to prepare the CNT array (CNTs). The CNT array has an average G/D ratio of 10.

Then, a copper sheet (substrate) having a thickness of 80 µm was prepared, and two resin sheets having a thickness of about 30 µm and formed from PFA were prepared.

Then, the resin sheet was disposed on both front and back sides of the copper sheet, thereby preparing a fixture sheet.

Then, the above-described CNT arrays were disposed on both front and back sides of the resin sheet. A pressure of 500 kPa was applied from outside in the thickness direction so that the two CNT arrays face the copper sheet, and heated to 390° C. and the temperature was kept for 5 minutes. In this manner, the resin sheet was allowed to closely contact the copper sheet, and the CNT array was embedded so as to penetrate the resin sheet and contact the copper sheet.

Thereafter, cooling is conducted to the room temperature, and the pressure is released, thereby producing a thermal conductive sheet (primary thermal conductive sheet).

Preparation Example 2

A CNT array was prepared in the same manner as in Preparation Example 1, except that the growth substrate was heated to 700° C., and a source gas (acetylene gas) was supplied to the catalyst layer for 15 minutes. In the CNT array, the CNT was a multi-walled carbon nanotube, and the CNT had an average external diameter of about 12 nm, an average length of about 300 µm, and the VACNTs had a bulk density of about 50 mg/cm$^3$.

Then, the CNT array (width 20 mm, length 30 mm, height 300 µm) was accommodated in a heat-resistant carbon vessel (internal height 1 mm), and the carbon vessel was placed in a resistance heating furnace.

Then, inside the resistance heating furnace was replaced with an argon atmosphere, and thereafter the temperature was increased at 10° C./min to 2800° C., and kept at 2800° C. for 2 hours. In this manner, the CNT array was densified, and thereafter, cooled to room temperature by natural cooling (about −100° C./min).

The densified CNT array had a volume relative to the preheating CNT array volume of about 40%. The densified CNT array had a bulk density of about 125 mg/cm$^3$. The densified CNT array had an average G/D ratio of 18.

Then, two densified CNT arrays were prepared in the above-described manner.

Then, the densified CNT array was embedded in the resin sheet of the fixture sheet in the same manner as in Preparation Example 1, thereby preparing a primary thermal conductive sheet.

Preparation Example 3

A primary thermal conductive sheet was produced in the same manner as in Preparation Example 1, except that in the step of embedding the CNT array so as to penetrate the resin sheet and contact the copper sheet, the temperature of 370° C. was kept for 5 minutes.

In the CNT array, the CNT had an average length of about 100 µm. The CNT array had a bulk density of about 50 mg/cm$^3$, and the CNT array had an average G/D ratio of 10.

Preparation Example 4

The VACNTs were formed on both of the front face and back face of the substrate in the same manner as in Preparation Example 1. Then, the growth substrate on which VACNTs were disposed on both sides was named a primary thermal conductive sheet.

Preparation Example 5

A CNT array was prepared in the same manner as in Preparation Example 1, by forming the VACNTs on both front face and back face of the substrate, and shifting a cutter blade along the growth substrate to separate the VACNTs from the growth substrate. Then, the CNT array was named a primary thermal conductive sheet.

Example 1

The primary thermal conductive sheet produced in Preparation Example 1 was sandwiched between the heat release member and the electronic component as shown in FIG. 5B, and used as a TIM.

Thereafter, the thermal conductive sheet was taken out from between the heat release member and the electronic component. As the plurality of CNTs of the thermal conductive sheet were checked, the plurality of CNTs were fallen down so as to lie one above another relative to the fixture sheet. In this manner, a secondary thermal conductive sheet was prepared.

Then, an adhesive tape (mending tape, manufactured by 3M) was attached to the CNT array of the secondary thermal conductive sheet from the opposite side of the copper sheet at 1.02 g/cm$^2$ (100 kPa). The adhesive tape had adhesion force of 2.7 N/cm in accordance with 90° peel test of JIS Z 0237.

Then, the adhesive tape was removed from the CNT array at a removal speed of 10 mm/s so that the peeling angle was 90°. In this manner, the plurality of CNTs were uplifted relative to the fixture sheet, as shown in FIG. 11.

Figure 11:
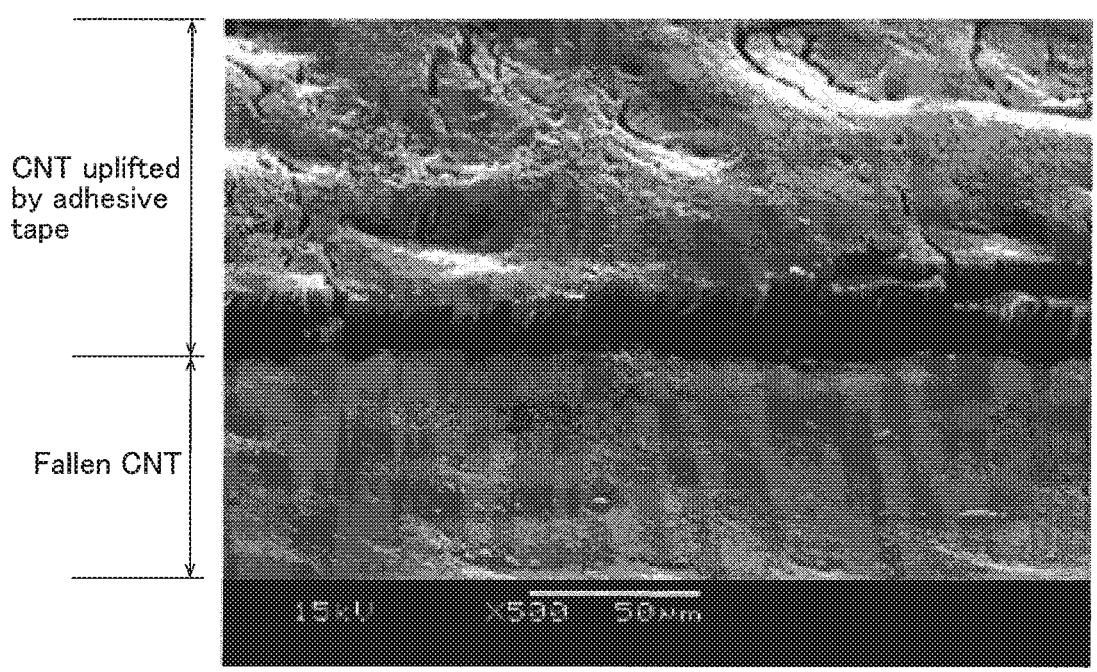
FIG. 11 shows a scanning electron microscope (SEM) image of the CNT array of Example 1, in which uplifting is performed by an adhesive tape.

In the upper side portion of FIG. 11, the plurality of CNTs are uplifted relative to the fixture sheet by the attaching and removing of the adhesive tape, and at the lower side portion of FIG. 11, attaching and removing of the adhesive tape were not performed, and the plurality of CNTs were fallen down so as to lie one above another relative to the fixture sheet.

In the above-described manner, a tertiary thermal conductive sheet was produced. Table 1 shows adhesion force of the adhesive tape, attaching and removal conditions of the adhesive tape in Examples 1 to 8 and Comparative Examples 1 and 2.

Example 2

A tertiary thermal conductive sheet was produced in the same manner as in Example 1, except that the adhesive tape was removed from the CNTs so that peeling angle of the adhesive tape to the fixture sheet was 180°.

Example 3

A tertiary thermal conductive sheet was produced in the same manner as in Example 1, except that the removal speed was changed to 1 mm/s.

Example 4

A tertiary thermal conductive sheet was produced in the same manner as in Example 1, except that the adhesive tape (mending tape, manufactured by 3M) was changed to an adhesive tape (heat-resistant masking tape, manufactured by 3M, SCOTCH 5413, adhesion force: 2.8 N/cm).

Example 5

A tertiary thermal conductive sheet was produced in the same manner as in Example 1, except that the adhesive tape (mending tape, manufactured by 3M) was changed to an adhesive tape (adhesion film, manufactured by Hitachi Chemical Co., Ltd., Hitalex L-3310, adhesion force: 0.6 N/cm (15 cN/25 mm)).

Example 6

A tertiary thermal conductive sheet was produced in the same manner as in Example 1, except that the attaching pressure of the adhesive tape to the CNTs was changed to 10 kg/cm$^2$.

Example 7

A tertiary thermal conductive sheet was produced in the same manner as in Example 1, except that the primary thermal conductive sheet produced in Preparation Example 1 was changed to the primary thermal conductive sheet produced in Preparation Example 2.

Example 8

A tertiary thermal conductive sheet was produced in the same manner as in Example 1, except that the primary thermal conductive sheet produced in Preparation Example 1 was changed to the primary thermal conductive sheet produced in Preparation Example 3.

Comparative Example 1

The primary thermal conductive sheet produced in Preparation Example 4 (growth substrate on both surfaces of which VACNTs were disposed) was sandwiched between the heat release member and the electronic component, and used as the TIM. At this time, a portion of the VACNTs was chipped, and the CNT dropped.

Thereafter, the thermal conductive sheet was taken out from between the heat release member and the electronic component. As the VACNTs of the thermal conductive sheet was checked, the plurality of CNTs were fallen down so as to lie one above another relative to the growth substrate. In this manner, the secondary thermal conductive sheet was prepared.

Then, the adhesive tape (mending tape, manufactured by 3M) was attached to the VACNTs in the same manner as in Example 1, and then removed from the VACNTs. At this time, a portion of the VACNTs adhered to the adhesive tape, and separated from the growth substrate.

Comparative Example 2

A thermal conductive sheet was prepared in the same manner as in Comparative Example 1, except that the primary thermal conductive sheet produced in Preparation Example 4 (growth substrate on which VACNTs were disposed on both sides thereof) was changed to the primary thermal conductive sheet produced in (CNT array) Preparation Example 5.

In Comparative Example 2, when the primary thermal conductive sheet was sandwiched between the heat release member and the electronic component, a portion of the primary thermal conductive sheet was chipped and the CNT was dropped. When the adhesive tape was removed, a portion of the plurality of CNTs adhered to the adhesive tape.

Comparative Example 3

A secondary thermal conductive sheet was prepared in the same manner as in Example 1 by using the primary thermal conductive sheet produced in Preparation Example 1 was used, as shown in FIG. 5B, as TIM, and then taken out from between the heat release member and the electronic component.

Evaluation (1) Thermal Resistance Measurement

Thermal resistance of the thermal conductive sheet (to be specific, primary thermal conductive sheet of Preparation Example 1, tertiary thermal conductive sheet of Example 1, primary thermal conductive sheet of Preparation Example 3, and tertiary thermal conductive sheet of Example 8) produced in Preparation Examples and Examples was measured with a thermal resistance measurement device (trade name: T3Ster DynTIM Tester, manufactured by Mentor Graphics Corp).

Figure 12:
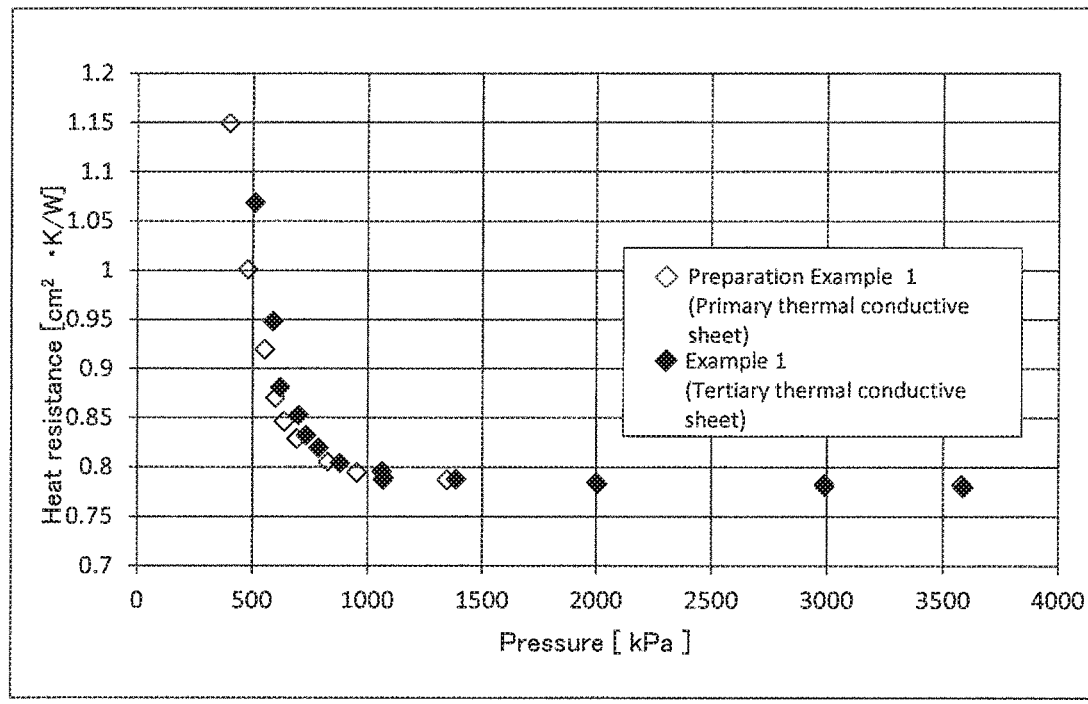
FIG. 12 is a graph illustrating the thermal resistance of the thermal conductive sheet of Preparation Example 1 and Example 1.
Figure 13:
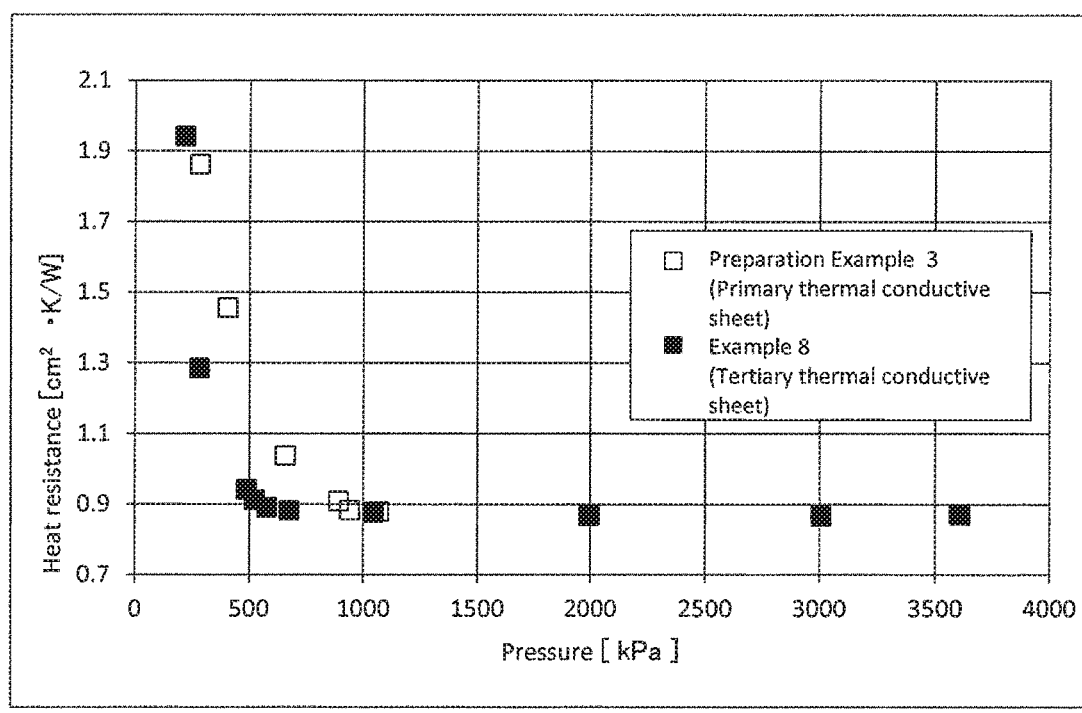
FIG. 13 is a graph illustrating the thermal resistance of the thermal conductive sheet of Preparation Example 3 and Example 8.

To be more specific, the thermal conductive sheet was sandwiched by a heater and a cold stage included in the thermal resistance measurement device from outside in the thickness direction, and a predetermined pressure was applied with the heater from outside in the thickness direction. Then, the thermal resistance of the thermal conductive sheet at different pressures was measured. FIG. 12 and FIG. 13 show the result.

FIG. 12 reveals that the primary thermal conductive sheet of Preparation Example 1 and the tertiary thermal conductive sheet of Example 1 had equivalent thermal resistances. That is, it was confirmed that the tertiary thermal conductive sheet of Example 1 could be suitably reused as TIM.

FIG. 13 reveals that when the heater pressure was 800 kPa or less, the primary thermal conductive sheet of Preparation Example 3 could not achieve reduction in thermal resistance sufficiently compared with the tertiary thermal conductive sheet of Example 8.

In the primary thermal conductive sheet, the resin enters between the plurality of CNTs (present partially), and therefore the plurality of CNTs hardened, and unsuitable characteristics as TIM may be exhibited (reduction in conformability, etc.). In the primary thermal conductive sheet of Preparation Example 3, the plurality of CNTs are hard, and therefore when the heater pressure was 800 kPa or less, it could not sufficiently conform to the heater and the cold stage.

Meanwhile, with the tertiary thermal conductive sheet, the plurality of CNTs are once fallen down, and then uplifted, and therefore the resin entered into the plurality of CNTs was damaged, and the plurality of CNTs were loosened. Therefore, with the tertiary thermal conductive sheet, compared with the primary thermal conductive sheet, a plurality of soft CNTs can be produced. In this regard, in the tertiary thermal conductive sheet of Example 8, flexibility of the plurality of CNTs was improved, and even if the heater pressure was 800 kPa or less, it sufficiently conformed to the heater and the cold stage.

(2) Uplifting Test

Conditions of the plurality of CNTs in the thermal conductive sheet produced in Examples and Comparative Examples was checked with a scanning electron microscope SEM. The conditions of the plurality of CNTs were evaluated based on the following criteria. The results are shown in Table 1.

A: the plurality of CNTs excellently uplifted entirely relative to the fixture sheet.

B: majority of the plurality of CNTs excellently uplifted relative to the fixture sheet but a portion of the plurality of CNTs was fallen down so as to lie one above another relative to the fixture sheet.

C: the plurality of CNTs excellently uplifted entirely relative to the fixture sheet but the adhesive agent of the adhesive tape adhered to a portion of the plurality of CNTs and the portion of the plurality of CNTs was contaminated.

D: uplifting of the fixture sheet of the plurality of CNTs was not confirmed or a portion of the plurality of CNTs adhered to the adhesive tape and separated from the thermal conductive sheet.

TABLE 1

| | | no. | | | | | |
|---|---|---|---|---|---|---|---|
| | | Example 1 | Example 2 | Example 3 | Example 4 | Example 5 | Example 6 |
| Thermal conductive sheet | Prep. Ex. No. | | | | Prep. Ex. 1 | | |
| | CNT length | | | | 150 | | |
| | Resin layer thickness | | | | 30 | | |
| Adhesive tape | Adhesion force [N/cm] | | 2.7 | | 2.8 | 0.6 | 2.7 |
| | Attaching pressure [kg/cm$^2$] | | | 1.02 | | | 10 |
| | Peeling angle [°] | 90 | 180 | 90 | 90 | 90 | 90 |
| | Peeling speed [mm/s] | 10 | 10 | 1 | 10 | 10 | 10 |
| Evaluation | Uplifting test | A | A | A | A | B | C |

| | | no. | | | |
|---|---|---|---|---|---|
| | | Example 7 | Example 8 | Comp. Ex. 1 | Comp. Ex. 2 |
| Thermal conductive sheet | Prep. Ex. No. | Prep. Ex. 2 | Prep. Ex. 3 | Prep. Ex. 4 | Prep. Ex. 5 |
| | CNT length | 300 | 100 | 150 | 150 |
| | Resin layer thickness | | 30 | | |
| Adhesive tape | Adhesion force [N/cm] | | 2.7 | | |
| | Attaching pressure [kg/cm$^2$] | | 1.02 | | |
| | Peeling angle [°] | 90 | 90 | 90 | 90 |
| | Peeling speed [mm/s] | 10 | 10 | 10 | 10 |
| Evaluation | Uplifting test | A | A | D | D |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The carbon nanotube structure of the present invention can be used for various industrial products, and can be used for, for example, thermal conductive sheet, conveyer belt, vibration isolator, and heat insulating material.

The method for uplifting a carbon nanotube structure of the present invention can be suitably used for recycling and maintenance of the carbon nanotube structure used in various industrial products.

The method for producing a carbon nanotube structure of the present invention can be suitably used for production of a carbon nanotube structure used in various industrial products.

DESCRIPTION OF REFERENCE NUMERALS 1 thermal conductive sheet
2 fixture sheet
3 CNT array
6 CNT
8 adhesive tape
15 growth substrate
30 conveyer belt

The invention claimed is:

1. A method for uplifting a carbon nanotube structure, the carbon nanotube structure including a fixture sheet and a carbon nanotube array,
wherein in the carbon nanotube array, a plurality of carbon nanotubes removed from a growth substrate are aligned in a predetermined direction, and at least a portion of the plurality of carbon nanotubes is embedded in or bonded to the fixture sheet,
the method comprising the steps of:
preparing a carbon nanotube structure, in which at least a portion of the plurality of carbon nanotubes is fallen down so as to lie one above another relative to the fixture sheet,
attaching an adhesive tape to the carbon nanotube array, and removing the adhesive tape from the carbon nanotube array to uplift the plurality of carbon nanotubes relative to the fixture sheet.

2. A method for producing a carbon nanotube structure, the method comprising the steps of:
preparing a carbon nanotube structure including a fixture sheet and a carbon nanotube array, in which a plurality of carbon nanotubes removed from a growth substrate are aligned in a predetermined direction, and at least a portion of the plurality of carbon nanotubes is embedded in or bonded to the fixture sheet,
allowing at least a portion of the plurality of carbon nanotubes to fall down so as to lie one above another relative to the fixture sheet,
attaching an adhesive tape to the carbon nanotube array, and
removing the adhesive tape from the carbon nanotube array to uplift the plurality of carbon nanotubes relative to the fixture sheet.

3. The method for producing a carbon nanotube structure according to claim 2, wherein the following set of the steps is performed a plurality of times:
allowing at least a portion of the plurality of carbon nanotubes to fall down so as to lie one above another relative to the fixture sheet,
attaching the adhesive tape to the carbon nanotube array, and
removing the adhesive tape from the carbon nanotube array to uplift the plurality of carbon nanotubes relative to the fixture sheet.

* * * * *